United States Patent [19]
Motamed et al.

[11] Patent Number: 5,714,906
[45] Date of Patent: Feb. 3, 1998

[54] CONSTANT TRANSDUCTANCE INPUT STAGE AND INTEGRATED CIRCUIT IMPLEMENTATIONS THEREOF

[76] Inventors: Ali Motamed, 101 Curl Dr., Jones Tower #724, Columbus, Ohio 43210; Chang Ku Hwang, 1228 Minuteman Ct., Columbus, Ohio 43220; Mohammed Ismail, 3036 Green Arbor La., Dublin, Ohio 43017

[21] Appl. No.: 514,910

[22] Filed: Aug. 14, 1995

[51] Int. Cl.$^6$ .................................................. H03F 3/45
[52] U.S. Cl. ........................ 327/563; 327/58; 327/62; 330/253; 330/257
[58] Field of Search ............................ 330/253, 257; 327/563, 562, 561, 560, 62, 63, 58

[56] References Cited

U.S. PATENT DOCUMENTS

| | | | |
|---|---|---|---|
| 4,649,352 | 3/1987 | Blauschild | 330/252 |
| 5,142,244 | 8/1992 | Glica et al. | 330/253 |
| 5,153,529 | 10/1992 | Koda et al. | 330/257 |
| 5,208,552 | 5/1993 | Ryat | 330/253 |
| 5,291,149 | 3/1994 | Nunoshima | 330/253 |
| 5,294,893 | 3/1994 | Ryat | 330/257 |
| 5,311,145 | 5/1994 | Huijsing et al. | 330/255 |
| 5,371,474 | 12/1994 | Wassenaar et al. | 330/253 |
| 5,384,548 | 1/1995 | Sakurai et al. | 330/253 |
| 5,455,535 | 10/1995 | Sauer | 327/563 |

FOREIGN PATENT DOCUMENTS

| | | | |
|---|---|---|---|
| 1162006 | 6/1989 | Japan | 330/253 |
| 2250512 | 10/1990 | Japan | 330/253 |
| 4-81109 | 3/1992 | Japan | 330/253 |

OTHER PUBLICATIONS

Botma et al., "Rail–to–Rail Constant–Gm Input Stage and Class AB Output Stage for Low–Voltage CMOS Op Amps", Analog Inegrated Circuits and Signal Processing, pp. 121–133, 1994.

Duqui–Carrillo et al., "Constant–Gm Rail–to–Rail Common–Mode Range Input Stage with Minimum CMRR Degradation", IEEE Journal of Solid–State Circuits, vol. 28, No. 6, pp. 661–666, Jun. 1993.

Botma et al., "Simple Rail–to–Rail Low Voltage Constant–Transconductance CMOS Input Stage in Weak Inversion", Electronics Letters, vol. 29, No. 12, pp. 1145–1147, Jun. 1993.

Hogervorst et al., "CMOS Low–Voltage Operational Amplifiers with Constant–Gm Rail–to–Rail Input Stage", Proceedings of the IEEE International Symposium on Circuits and Systems, pp. 2876–2879, 1992.

Huijsing et al., "Low–Voltage Operational Amplifier with Rail–to–Rail Input and Output Ranges", IEEE Journal of Solid–Stage Circuits, vol. SC–20, No. 6, pp. 1144–1150, Dec. 1985.

Fisher et al., "A Highly Linear CMOS Buffer Amplifier", IEEE Journal of Solid–State Circuits, vol. SC–22, No. 3, pp. 330–334, Jun. 1987.

*Primary Examiner*—Timothy P. Callahan
*Assistant Examiner*—Terry L. Englund
*Attorney, Agent, or Firm*—Mueller and Smith, LPA

[57] ABSTRACT

A low voltage constant transconductance input stage is achieved with relatively simple design methodology. The approach uses current-mode techniques and is based upon the processing of signal currents, rather than handling the bias currents of input stages. Such an approach becomes universal and independent of the input stage transistor types (FET or bipolar) and their operating regions. Further, the arrangement considerably simplifies the design procedure of low voltage operational amplifiers. MOS and bipolar Op Amp input stages are described wherein almost constant $g_m$ is achieved which is independent of the common mode input voltage ranging from rail-to-rail.

24 Claims, 24 Drawing Sheets

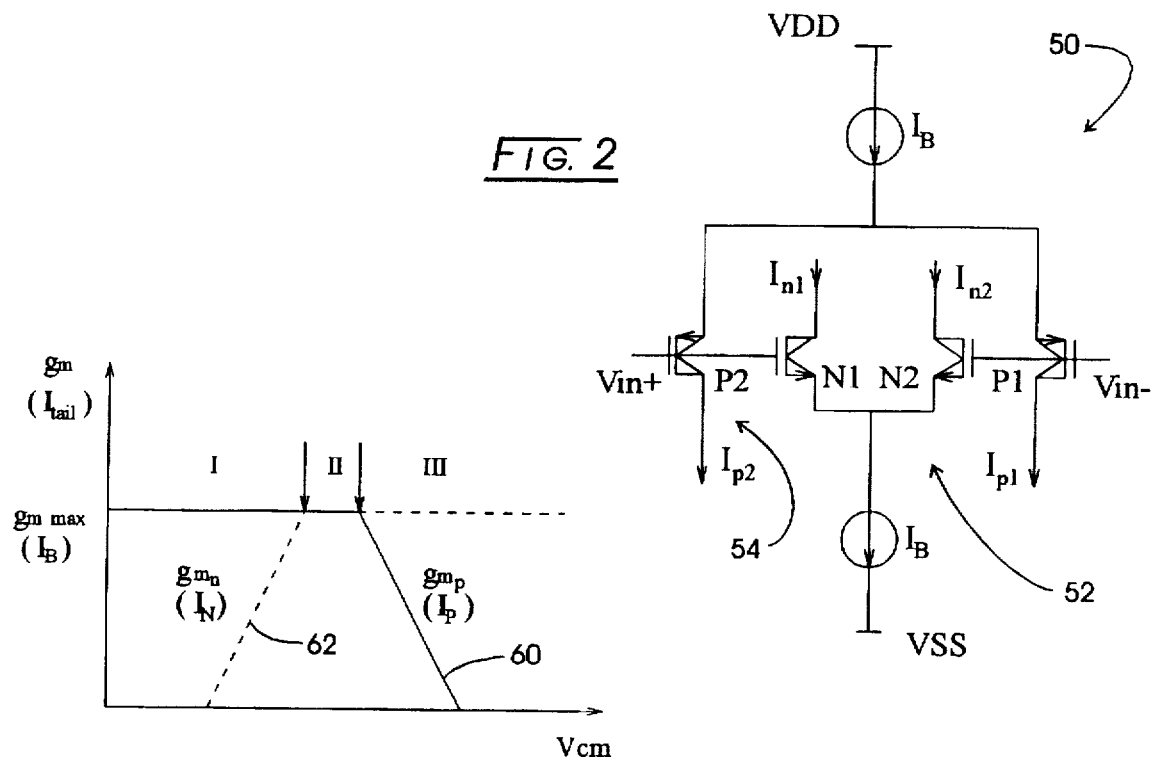

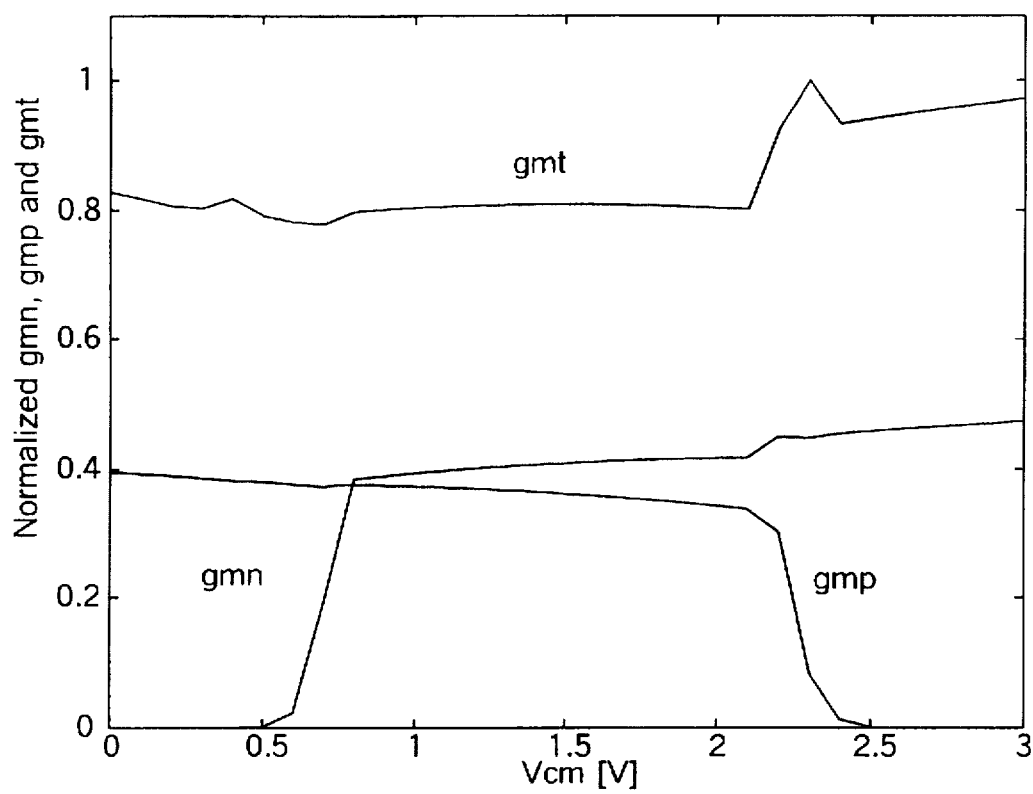
FIG. 30
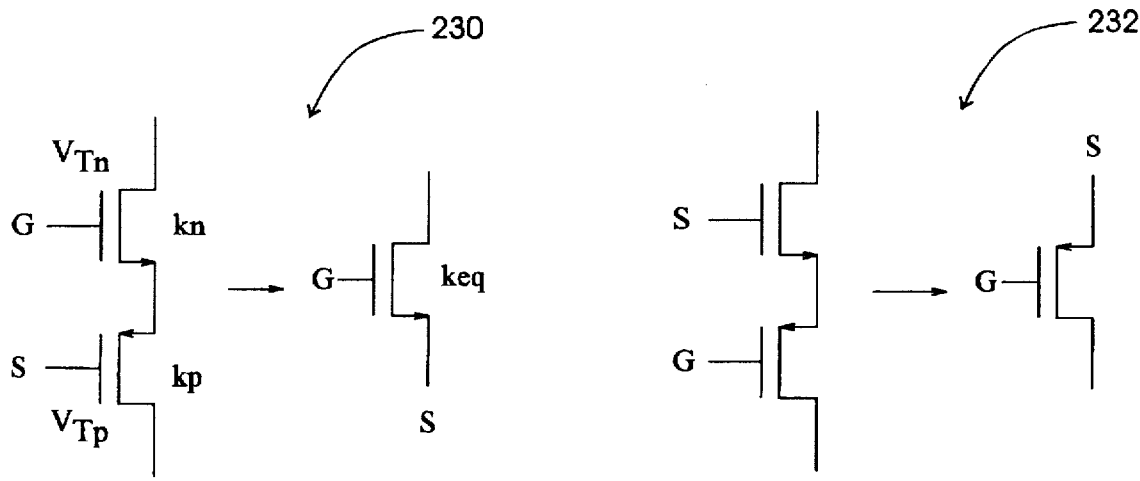
FIG. 31A
FIG. 31B

CONSTANT TRANSDUCTANCE INPUT STAGE AND INTEGRATED CIRCUIT IMPLEMENTATIONS THEREOF

BACKGROUND OF THE INVENTION

Over the past several decades the technology of electronics has evolved from the vacuum tube to the discretely employed transistor and then to the integrated circuit (IC). The latter technology has advanced to custom circuit integration or microelectronics involving a science generally referred to as "very large scale integration" (VLSI). This technological evolution has generated very high component densities providing circuits not only evidencing substantial operational capabilities but also advantageously providing lower costs for the functions achieved. These enhanced functional capabilities further are accompanied by a more compact sizing.

In general, the component structure modalities used in integrated circuit technology will be Bipolar or metal-oxide-semiconductor (MOS) the latter being manifested in general as an employment of field effect transistor devices (FET). In connection with the latter technology, complementary-circuit MOS integrated devices (CMOS) were introduced to industry in about 1968. Since that time, industry has continued to reduce the minimum feature size of circuit components, such as MOS transistors to achieve the noted greater component densities. High density integrated circuits generally have been evolved in the development of digital circuits whose role is increasing at quite a rapid rate.

Notwithstanding the interest of investigators in digital functioning technology, it has been observed that a need is present and building to generate practical analog-based integrated circuitry and this realization is manifested in the interest of investigators in the development of hybrid or mixed-mode systems joining both analog circuitry and digital circuitry on a common chip. For example, the following commentary has been made:

> However since we live in an analog world, we cannot avoid processing analog signals and in many cases it is more natural to use analog, rather than digital signal processing.

S. Sakurai and M. Ismail, "Low-Voltage CMOS Operational Amplifiers: Theory, Design, and Implementation", 1995, Kluwer Academic Publishers.

Posed with the desirability of higher and higher component densities is a corresponding call for lower power consumption by these circuits, as well as a recognition that there are certain physical constraints as the level of miniaturization proceeds. For example, the scaling of a transistor is a three-dimensional consideration and hence the gate oxide thickness will be reduced along with the channel length and width. As channel length is scaled down into deep-submicron ranges and the gate oxide thickness reduces to only several nano-meters, the maximum allowable power supply voltage must be reduced for this technology to about 3 volts as opposed to the 5 volt levels conventionally employed.

In general, the integration of analog circuitry will essentially always involve employment of the ubiquitous operational amplifier (Op Amp). This has posed a challenge to investigators of analog circuits in scaled CMOS processes, inasmuch as a nearly 2 volt decrease in the maximum signal swing is imposed while transistor threshold voltage, $V_T$, remains almost constant. Thus, over the recent past, the activities of investigators in the development of effective low voltage performance with operational amplifiers has been observed with substantial interest. For example, with the reduction of supply voltage, the common mode input voltage of conventional Op Amps, defined as the input voltage range over which the input stage properly responds to differential input signals as a linear amplifier, becomes very small. To keep the signal-to-noise ratio as large as possible, particularly in non-inverting Op Amp circuits, the common mode input voltage should be maintained as wide as possible. This may be accomplished by placing N-type and P-type input pairs in parallel, an approach discussed in the seminal publication concerning low voltage operation of Op Amps, see:

> J. H. Huijsing and D. Linbarger, "Low-voltage operational amplifier with rail-to-rail input and output ranges," IEEE Journal of Solid-State Circuits, vol. SC-20, pp 1144–1150, December 1985.

With such configurations, referred to as the "complementary input stage", the common mode input voltage may vary from rail to rail. However, the use of complementary input pairs results in certain drawbacks which may limit overall performance. Each pair exhibits a different DC behavior. The CMRR degrades when the common-mode input is such that one of the pairs is turning on or off. A much more serious drawback though is the variation of the input stage transconductance, gm, with the common-mode input voltage. When both input pairs operate, the overall transconductance varies by a factor of 2 from the level at which only one pair operates. Such variation causes signal distortion and introduces similar severe variation in the unity gain bandwidth. See in this regard:

> J. A. Ficher and R. Koch, "A highly linear CMOS buffer amplifier," IEEE Journal of Solid-State Circuits, vol. SC-22, pp. 330–334, June 1987.
>
> J. F. Duque-Carrillo, J. M. Valverde, and R. Perez-Aloe, "Constant gm rail-to-rail common-mode range input stage with minimum CMRR degradation," IEEE Journal of Solid-State Circuits, vol. SC-28, pp. 661–666, June 1993.
>
> S. Sakurai, "Design of Rail-to-Rail CMOS Operational Amplifiers for a 3-V Supply," Ph.D. Dissertation in Elec. Eng., Ohio State Univ., 1994

Several methods have been proposed in the literature to overcome the non-constant transconductance problem in attempts to achieve the elusive goal of designing a rail-to-rail constant transconductance input stage. All such proposed methods will be seen to be based upon a singular fundamental concept, to wit, controlling DC tail currents of the differential input stages. The first approach involves maintaining the sum of the tail currents constant in order to achieve a constant transconductance, expressed as $gm_T = gmn + gmp$. Examples include Bipolar junction transistor input pairs as discussed in the following publications:

> J. H. Huijsing, et at., supra
>
> J. Fonderie, Design of Low Voltage Bipolar Operational Amplifiers, Boston: Kluwer Academic Publishers, 1993.

as well as CMOS input pairs operating in the weak inversion region. See:

> J. A. Ficher, et al., supra
>
> J. H. Botma, R. F. Wassenaar, and R. J. Wiegerink, "Simple rail-to-rail low-voltage constant transconductance CMOS input stage in weak inversion," Electron. Lett., vol. 29, pp. 1145–1147, 1993.
>
> M. Ismail and T. Fiez, Analog VLSI Signal and Information Processing. McGraw Hill, 1994.

In the second approach, constant transconductance is achieved by maintaining the sum of the square roots of the tail currents constant. As an example, CMOS input pairs are operated in the strong inversion regions. See in this regard:

M. Ismail, et al., supra

R. Hogervorst, R. J. Wiegerink, P. A. L. deJong, J. Fonderie, R. F. Wassenaar, and J. H. Huijsing, "CMOS low-voltage operational amplifier with constant gm rail-to-rail input stage," Proceedings of the IEEE International Symposium on Circuits and Systems, 1992.

R. F. Wassenaar, J. H. Huijsing, R. H. Wiegerink, R. Hogervorst, and J. P. Terro, "Differential amplifier having rail-to-rail input capability and square-root current control," U.S. pat. appln. Ser. No. 880,881, 1992.

J. H. Botma, R. J. Wiegerink, S. L. J. Gierkink, and R. F. Wassenaar, "Rail-to-rail constant gm input stage and class AB output stage for low-voltage CMOS op amps," Analog Integrated Circuits and Signal Processing, vol. 6, pp. 121–133,1993.

None of the approaches discussed above may be applied universally at the same time to both Bipolar and MOS input stages operating in the weak and/or the strong inversion region, since the technique for seeking to achieve a constant transconductance is different for each case. Consequently, special and elaborate non-traditional bias circuitry has been called for in each case which, for some applications or designs, will be seen to consume large static power.

SUMMARY

The present invention is addressed to integrated circuits and their method of performance wherein analog device differential input stages exhibit substantially constant transconductance in their performance while operating under the constraints of low voltage supplies. The underlying approach is universal in that it is independent of the input transistor types (MOS, Bipolar, or BiCMOS) and their operating regions (weak or strong inversion for MOS and active for Bipolar) to obtain rail-to-rail constant transconductance. This is achieved while still using simple, traditional bias circuitry. The new method and resultant integrated circuitry is based upon an approach wherein the signal currents are processed as opposed to earlier approaches wherein DC tail currents have been manipulated. Such an arrangement considerably simplifies the design, for example, of low voltage Op Amps and makes it more systematic. The approach may also significantly reduce static power consumption. The methodology of the invention and its associated circuitry is implemented in two ways, to wit the processing of either AC currents only or AC currents superimposed upon bias currents, i.e. the total instantaneous output currents of the input pairs of the differential stages employed. The present approach to achieving constant transconductance under low voltage implementation also is applicable to other analog circuit building blocks such as voltage-to-current converters (V-I converters) and analog multipliers.

Another feature of the invention provides an integrated circuit which comprises a differential stage having at least an N-type transistor pair and at least a P-type transistor pair, the N-type and P-type transistor pairs being electrically coupled in parallel and responsive to an applied input to derive corresponding current outputs which are common mode voltage dependent. Additionally, a selection circuit is provided which is responsive to the current outputs and provides a selected current output, $I_o$, corresponding with the current output which exhibits a maximum current amplitude and maximum stage transconductance as an input to a next stage of the integrated circuit.

An additional feature of the invention provides an integrated circuit which comprises a differential stage having an N-type transistor pair and a P-type transistor pair, the N-type and P-type transistor pairs performing in conjunction with a bias current, $I_B$, and being electrically coupled in parallel and responsive to an applied input to derive respective current outputs, In1, In2, and Ip1, Ip2 corresponding with the applied input and combined with a DC term. A processing circuit is provided for subtracting the current outputs In1, In2, Ip1 and Ip2 from the bias current, In to derive subtracted currents In1', In2', Ip1' and Ip2', each exhibiting a DC term. A first selector circuit is provided which is responsive to a first two subtracted currents In1' and Ip1' for deriving an initial output Io1 corresponding with a minimum amplitude of the first two simultaneously occurring subtracted currents. A second selector circuit responds to a second two of the subtracted currents In2' and Ip2' for deriving an initial output Io2 corresponding with a minimum amplitude of the second two simultaneously occurring subtracted currents. These initial outputs Io1 and Io2 may be subtractively combined to derive a selected output, io exhibiting no DC term.

A further feature of the invention provides a method for operating an integrated circuit to enhance the consistency of the transconductance exhibited by it, the circuit comprising a differential input stage having at least a first transistor pair of a first conductivity type deriving a first output in response to an applied input signal and having at least a second transistor pair of a second conductivity type electrically coupled in parallel with the first transistor pair and responsive to the applied input to derive a second output, the method comprising the steps of:

simultaneously processing the first and second outputs with respect to the amplitudes exhibited thereby;

selecting that instantaneously occurring one of the outputs exhibiting the highest amplitude; and inputting a selected output corresponding with that highest amplitude to a next stage of the integrated circuit.

Other objects of the invention will, in part, be obvious and will, in part, appear hereinafter. The invention, accordingly, comprises the apparatus and method possessing the construction, combination of elements, arrangement of parts, and steps which are exemplified in the following description.

For a fuller understanding of the nature and objects of the invention, reference should be had to the following detailed description taken in connection with the accompanying drawings.

BRIEF DESCRIPTION OF THE DRAWINGS

FIG. 2 is a schematic diagram showing a complementary input stage;

FIG. 3 is a graph showing transconductance gmn and gmp variation as a function of the common mode input voltage for three regions;

FIG. 4 is a schematic drawing of a complementary input stage for one circuit structuring approach of the invention;

FIG. 30 is a graph showing a simulation result of the normalized transconductance of the input stage of FIG. 28 implemented with MOS transistors operating in weak inversion;

FIGS. 31A and 31B show composite transistors respectively realizing NMOS and PMOS;

DETAILED DESCRIPTION

In the discourse to follow, initially a schematic, partially block representation of an Op Amp device with the generalized representation of earlier transconductance control attempts is illustrated. Then, for initial comparison, a corresponding diagram of the approach of the instant invention is set forth. With this introduction, the principle of operation of the instant method and associated circuits is addressed in connection with a somewhat generic representation of a complementary input stage and, utilizing the symbol identification for complementary stage current. Then, the technique of the invention in terms of two general approaches for implementing a maximum gm selecting circuit are set forth with attendant proofs. Lastly, the implementation of the above with circuit topology is described and illustrated.

Figure 1A:
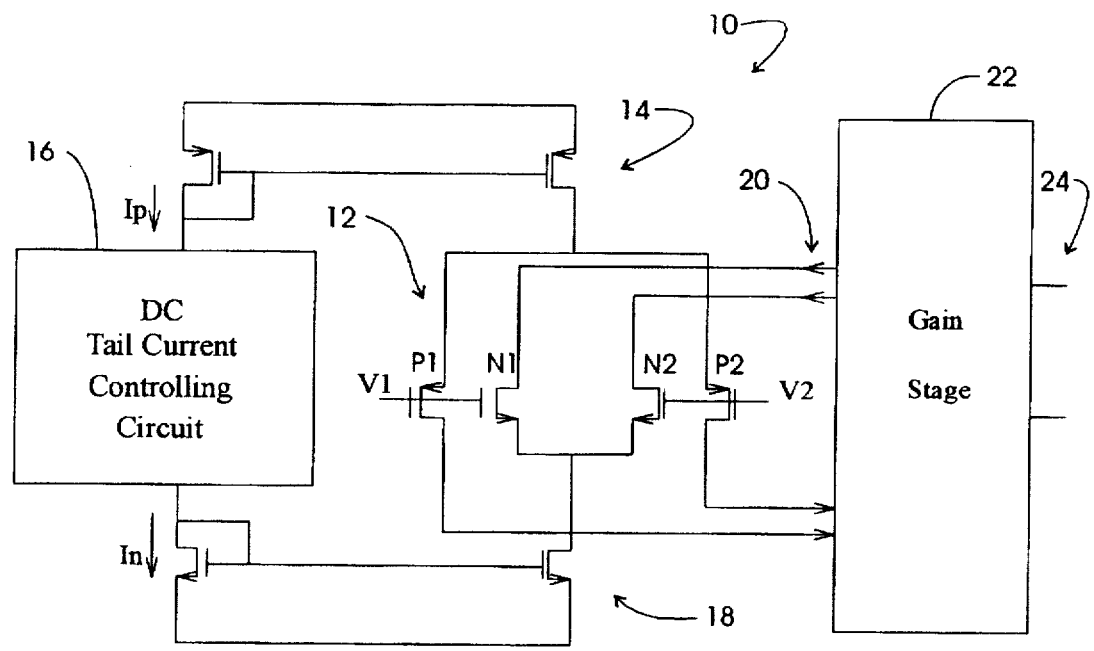
FIG. 1A is a schematic drawing showing the prior art approach for attempting constant transconductance by tail current control.

Looking to FIG. 1A, the heretofore conventional approach striving to achieve a constant transconductance across devices such as an operational amplifier is represented generally at 10. The complementary input stage of device 10 is represented generally at 12 and is seen to include an inner transistor pair N1–N2 which is coupled in parallel with an outwardly disposed transistor pair P1–P2. The tail current, $I_p$ of outer pair P1–P2 is controlled from a mirror network 14 by a tail current controlling circuit represented at block 16. Similarly, the tail current, In, for the inner transistor pair N1–N2 is developed from a mirror circuit 18 also controlled from circuit 16. The differential output of input stage 12 is presented via the four line array represented at 20 to a gain stage represented at block 22 for further outputting as represented at lines 24. The approach thus schematically represented, as noted in the above publications, suffers a variety of disadvantages including error deviation from a constant transconductance approaching, for example, 20%.

Figure 1B:
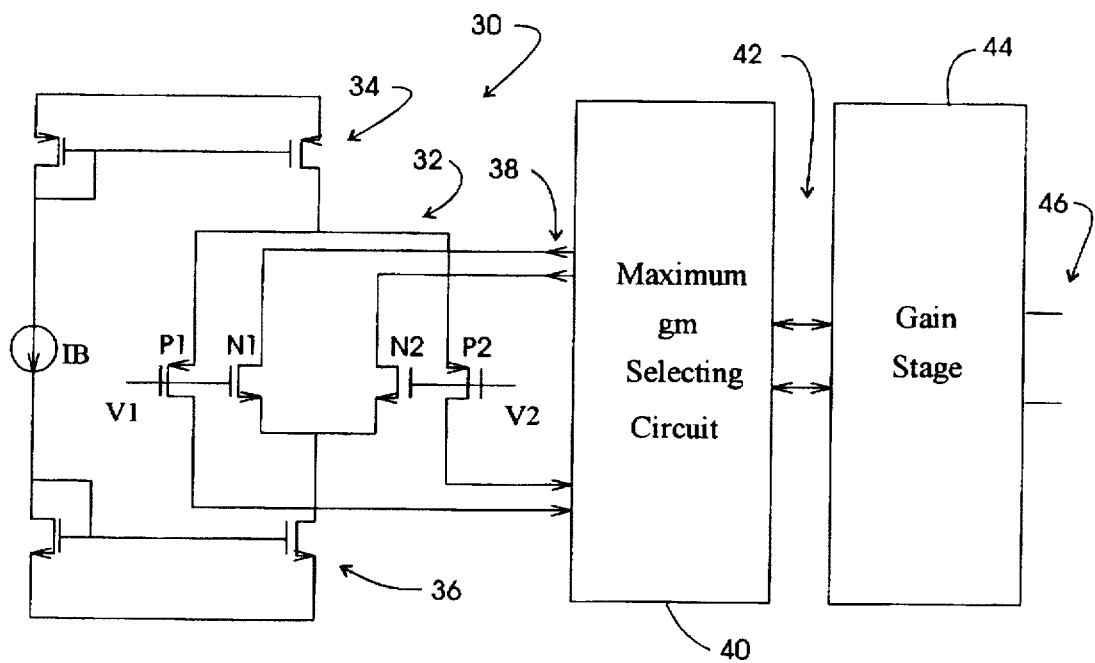
FIG. 1B is a schematic diagram showing the method of the present invention for obtaining rail-to-rail constant transconductance.

Looking to FIG. 1B, the approach now presented and described herein is schematically represented. In the figure, an OpAmp is represented in general at 30, the complementary input stage of which as represented generally at 32 includes an inner transistor pair N1–N2 which is coupled in parallel with an outer transistor pair P1–P2 as in the case of FIG. 1A. The bias currents of outer transistor pair P1–P2 are developed at mirror circuit 34 and their total may be represented as 1B. In similar fashion, the bias current with respect to inner transistor pair N1–N2 is provided at mirror circuit 36. The output of stage 32 is coupled via line array 38 to a maximum transconductance selecting circuit represented at block 40. In contradistinction to the prior art techniques represented in FIG. 1A, the approach of the present invention is based upon the processing of signal currents rather than manipulating the bias currents or tail currents as heretofore carded out. This concept is universal from the standpoint that it is independent of the input transistor types such as MOS or Bipolar, and their operating region (weak or strong inversion for MOS and active for Bipolar). The approach achieves constant transconductance at a maximum value thereof at any common mode input voltage. Thus, the circuit 40 functions to select the output of that complementary stage exhibiting the greatest current amplitude at any given time for any given common mode voltage. With this approach, a constant transconductance gm (i.e. gm.max) for any common mode input voltage is achieved. The concept considerably simplifies the design procedures of low voltage Op Amps and may significantly reduce power consumption depending upon how the methodology is employed. Accordingly, circuit 40 selects that maximum gm value and outputs the corresponding differential input stage currents as represented at line array 42 to the device gain stage as represented at block 44. The resultant output is represented at fines 46.

Now considering the principle of operation or concept herein involved, reference initially is made to FIGS. 2 and 3. Looking to FIG. 2, a simple differential pair input stage is revealed using a generic symbolism for the stage components. In this regard, the symbols depicted for devices N1–N2 represent any N-type of Bipolar or FET device (silicon, GaAs, etc.). Correspondingly, devices P1–P2 are meant to represent any P-type of Bipolar or FET device (silicon, GaAs, etc.). The complementary input stage of FIG. 2, as represented generally at 50, as before, includes an inner transistor pair N1–N2 as represented generally at 52 and an outer transistor pair P1–P2 as represented generally at 54. The current to transistors N1 and N2, respectively, is represented at In1 and In2 while corresponding current from transistors P1 and P2 is represented, respectively at Ip1 and Ip2. The maximum available value for these currents is $I_B$.

Looking to FIG. 3, transconductance (the tail current) gmn($I_N$) and gmp($I_P$) variation as a function of common mode input voltage sweeping from rail-to-rail is graphically portrayed. In the figure, gmn.max and gmp.max are assumed to be equal. The figure shows three Regions I, II, and III. Further, two curves are shown, one at 60 being associated with the PMOS differential pair, and the second dotted curve seen at 62 corresponds with the parallel coupled NMOS differential pair. Note that these curves 60 and 62 overlap at Region II. While the parallel coupled differential pair will cover the entire rail-to-rail common mode input range, for common-mode input voltages approaching the positive supply voltage, the PMOS differential pair as represented at curve 60 will no longer contribute to input transconductance. Similarly, for common-mode input voltages approaching the negative supply rail, the NMOS differential pair will be off. Thus, only the P pair represented at curve 60, for the most part, will be operating in Region I, while the N pair, for the most part, will be operating in Region III, and each contribute within the overlap Region II. The key feature of the present invention is that, at the input stages, only that current is submitted to the gain stage 44 which has been selected as the tail current corresponding with maximum transconductance (gm.max). The additive techniques of the past are not employed, for example, which otherwise would cause what is referred to as a "bump" or doubling of the transconductance value in Region II, which then must be accommodated for.

With the above general aspects of the instant approach in mind, it may be observed initially that equations of the total instantaneous output currents of a simple differential pair, implemented in any VLSI technology, are well known and are discussed in a variety of references. See in this regard:

R. L. Geiger, P. E. Allen, and N. R. Strader, VLSI Design Techniques for Analog and Digital Circuits. McGraw Hill, 1990.

P. E. Allen and D. R. Holber, CMOS Analog Circuit Design. Saunders College Publishing, 1987.

S. Sakurai and M. Ismail, Low Voltage CMOS Operational Amplifiers: Theory, Design and Implementation (supra)

P. R. Gray and R. G. Meyer, Analysis and Design of Analog Integrated Circuits. 3rd. ed. New York: Wiley, 1993.

The currents in the two transistors of a noted pair are expressed as:

$$I_{o,1or1,1or2} = \frac{I_{tail}}{2} \pm gm \frac{v_{id}}{2} \qquad (1)$$

where $v_{id}$ is the small signal differential input voltage. This equation is general and valid regardless of the implementation at hand (MOS, Bipolar, etc.). The equation also may be employed to express output currents in different regions of operation such as the MOS weak and strong inversion regions exemplified in connection with FIG. 3 above. In this regard, it may be noted that the transconductance is $gm = I_{tail}/\alpha U_T$ for $v_{id} < 2U_T$ if the input differential pairs are Bipolar transistors or MOS transistors operating in weak inversion, while $$gm = \sqrt{2k I_{tail}} \text{ for } v_{id} < \left| \frac{2I_{tail}}{k} \right|^{1/2},$$

if the input differential pairs are MOS transistors operating in strong inversion, where $U_T$ is the thermal voltage, $\alpha$ is the weak inversion (sub threshold) slope (assume here that $\alpha$ is equal to 1) and $$k = k n, p = \frac{1}{2} \mu n, p C_{ox} \left( \frac{W}{L} \right)_{n,p},$$

where W/L is the aspect ratio of MOS transistor, the $\mu$ is the mobility and $C_{ox}$ is the gate oxide capacitance.

As noted above, as opposed to seeking to achieve a constant gm by manipulating DC tail current, $I_{tail}$, the present technique is universal, being based on expression (1) above. MOS circuits are used for the present demonstration for illustration purposes only and inasmuch as they may follow an exponential (weak inversion), or square-law model. With the notations and current directions shown in FIG. 2, the drain current pairs (In1,In2) and (Ip1,Ip2), of the complementary input stage can be expressed, based on expression (1) and assuming that $v_{in}^+ > v_{in}^-$, as:

$$In1 = \frac{I_N}{2} + gm,n\frac{v_{id}}{2} \quad (2)$$

$$In2 = \frac{I_N}{2} - gm,n\frac{v_{id}}{2} \quad (3)$$

$$Ip1 = \frac{I_P}{2} + gm,p\frac{v_{id}}{2} \quad (4)$$

$$Ip2 = \frac{I_P}{2} - gm,p\frac{v_{id}}{2} \quad (5)$$

In the above expressions In and Ip are the DC bias currents through the n-type and p-type differential pairs, respectively, which depend upon the input common mode voltage. When the common mode input voltage Vcm is swept from rail to rail, the complementary input pairs go through the following three operating regions which have been earlier identified in connection with FIG. 3.

Region I

When Vcm is close to the negative rail voltage, the p-type input stage is fully operating in such a way that the tail current is equal to its maximum $I_B$ while the tail current of the n-type input stage is smaller than $I_B$. In this region, the following relationships obtain:

$$In < I_p (=I_B), \; gmn < gmp \; (=gm,max) \quad (6)$$

Region II

When Vcm is in the middle-rail or overlap region, the tail currents of both n- and p-type input pairs reach their maximum value, namely $I_B$. Then, the following expression obtains:

$$I_N = I_p = I_B, \; gmn = gmp = gm,max \quad (7)$$

Region III

When Vcm is close to the positive rail, the n-type input stage is fully operated so that the tail current is equal to its maximum value $I_B$ while the tail current of the p-type input stage does not reach $I_B$. In this region, the following expression obtains:

$$I_N(=I_B) > I_p, \; gmn \; (=gm,max) > gmp \quad (8)$$

The method of the present invention resides in an observation that from expressions (2)–(5) above and under the conditions developed for each of the Regions I–III in expressions (6)–(8) above, respectively, only gm,max is selected and used throughout the entire input common mode voltage range. This results in a rail-to-rail constant-gm input stage. Reverting momentarily to FIG. 2, at any instant, the methodology of the invention looks to the amplitude of the variables In1, In2, and Ip1, Ip2. The equivalent of the maximum value for the variable as it exists with respect to Regions I–III then encountered is outputted to the gain stage 44 (FIG. 1B). Maximum and constant transconductance will be the result of the maximum selection approach inasmuch as that variable will be proportional to the outputted or selected current variable as shown above.

Two different approaches have been developed for implementing the overall concept of the invention. The first of such approaches is concerned with processing the differential small-signal output currents (AC signal currents) in isolation of the DC tail current, while a second approach handles the total instantaneous current (TIC) of the input pairs (AC signal current superimposed on the DC tail current through transistors).

Processing AC Signal Currents

In this approach, two AC signal currents $i_{dif1}$=In1–In2 and $i_{dif2}$=Ip1–Ip2 are obtained. Because the AC components of these currents, for example In1 and In2 differ in phase by 180°, by carrying out the subtraction, the amplitudes of the AC term are, in effect, added together while the DC term is subtracted and removed from the signal. Accordingly, only AC signal remains for selection treatment. A constant gm then is achieved by selecting that maximum of $i_{dif1}$ and $i_{dif2}$. Based upon the expressions (2)–(5), and (6)–(8) above, a resulting current may be written as:

$$io = MAX[i_{dif1}, i_{dif2}] = gm, max \, v_{id} \quad (9)$$

Therefore, gm is constant and equal to gm,max regardless of the input common mode voltage. Expression (9) can be verified by considering the operation in each of the three Regions I–III discussed above in connection with FIG. 3. According to expressions (2)–(5), and the previously mentioned conditions discussed in connection with expressions (6)–(8), $i_{dif1}$ and $i_{dif2}$ can be written as:

$i_{dif1}$=the difference between In1 and In2
 =gmnv$_{id}$ in Region II
 =gm,maxv$_{id}$ in Region II
 =gm,maxv$_{id}$ in Region III $i_{dif2}$=the difference between Ip1 and Ip2
 =gm,maxv$_{id}$ in Region I
 =gm,maxv$_{id}$ in Region II
 =gm,pv$_{id}$ in Region III Hence, the maximum current of $i_{dif1}$ and $i_{dif2}$ can be expressed as $$io = MAX \, [i_{dif1}, i_{dif2}]_{Region \, 1,2,3} = gm, max_{id} \quad (9A)$$

Expression (9A) guarantees that transconductance, gm, is constant and equal to maximum transconductance, gm,max, in the entire common mode input voltage range. An important aspect of this approach is that the input stage architecture is based on handling small signal currents which may consume much less power in comparison to other architectures.

Processing AC Signal Currents Superimposed on DC Tail Currents (TIC)

For this case of assuring proper input stage output selection, the DC term of the signal is retained. Such an arrangement permits two techniques to be developed for assuring substantially constant transconductance.

Method 1

The initial one of these techniques recognizes that as the amplitude of the information signal increases, the DC value or term with which it is associated also increases by a virtue of the activity of the common mode voltage. Thus as the common mode voltage, Vcm increases in value, the amplitude of the corresponding AC information signal also increases. As a consequence, the first technique is to pick that maximum output of the complementary input stage. This methodology may be expressed, using the terminology of FIG. 2 as follows:

Find two currents Io1 and Io2 which correspond to MAX[In1,Ip1] and MAX[In2,Ip2]. Upon determining Io1, Io2, they may be subtractively combined to provide an AC signal output not containing a DC term.

Method 2

A second (TIC) methodology employs a two step procedure under the consideration of expressions (2)–(5) and under the conditions developed in connection with expressions (6)–(8) above. To further clarify the terminology to be employed, reference additionally is made to the complementary input stage for this technique as shown at FIG. 4. Thus, as an initial step, and referring to FIG. 4, each drain current, In1, In2, Ip1, and Ip2 is subtracted from bias current, $I_B$. In this regard, it may be observed that by subtracting a maximum amplitude of a given drain current, then the minimum absolute value of that subtraction will correspond with the stage to be selected by selection circuit 40. As represented in FIG. 4, the subtraction will generate the variables In1', In2', Ip1', and Ip2'. Following the carrying out of this subtraction, outputs Io1 and Io2 are determined, respectively, as the minimums MIN(In1', Ip1') and MIN (In2', Ip2'). Thereafter, the resulting Io2 and Io1 are directed to the output.

For both of the methods above disclosed with respect to this TIC approach, the resulting output currents Io1 and Io2, having the forms, $$Io1 = \frac{I_B}{2} + gm,\max \frac{V_{id}}{2}$$

$$Io2 = \frac{I_B}{2} - gm,\max \frac{V_{id}}{2}$$

always maintain a constant transconductance (i.e. gm.max), regardless of the input common mode voltage and can be used as the input currents of the next stage. If necessary, the constant DC current, namely $I_B/2$ can be cancelled.

As proof of the foregoing, the approach for processing AC signal currents, herein deemed method 2 is considered for each of the three Regions I–III discussed in connection with FIG. 3.

Region I

For Region I and method 1, based upon expressions (2)–(5) above, the following expressions obtain:

$$Ip1 - In1 = \frac{I_B}{2} - \frac{I_N}{2} + (gm,\max - gmn)\frac{V_{id}}{2} \qquad (10)$$

$$Ip2 - In2 = \frac{I_B}{2} - \frac{I_N}{2} - (gm,\max - gmn)\frac{V_{id}}{2} \qquad (11)$$

For method 2, again considering Region I, subtracting In1, In2, Ip1, and Ip2 from the constant bias current $I_{B1}$ and applying expressions (2)–(5), the following expressions obtain:

$$In1' = I_B - In1 = I_B - \frac{I_N}{2} - gmn\frac{V_{id}}{2} \qquad (12)$$

$$In2' = I_B - IN2 = I_B - \frac{I_N}{2} + gmn\frac{V_{id}}{2} \qquad (13)$$

$$Ip1' = I_B - Ip1 = I_B - \frac{I_B}{2} - gm,\max\frac{V_{id}}{2} \qquad (14)$$

$$Ip2' = I_B - Ip2 = I_B - \frac{I_B}{2} + gm,\max\frac{V_{id}}{2} \qquad (15)$$

From expressions (12)–(15), the following expressions obtain:

$$In2' - Ip2' = \left(\frac{I_B}{2}\right) - \left(\frac{I_N}{2}\right) - (gm,\max - gmn)\frac{V_{id}}{2} \qquad (16)$$

$$In1' - Ip1' = \left(\frac{I_B}{2}\right) - \left(\frac{I_N}{2}\right) + (gm,\max - gmn)\frac{V_{id}}{2} \qquad (17)$$

In this Region I, $$\left|\left(gm,\max\frac{V_{id}}{2}\right)\right|_{\max} \leq \frac{I_B}{2}, \text{ and } \left|gmn\frac{V_{id}}{2}\right|_{\max} \leq \frac{I_N}{2},$$

expressions (10), (11), (16), and (17) are always greater than 0 because:

$$\left[\frac{I_B}{2} - \frac{I_N}{2}\right] \geq (gm,\max - gmn)\frac{V_{id}}{2} \qquad (18)$$

Therefore, (Io1, Io2) is equal to (Ip1, Ip2) and (Ip2', Ip1') in each of the two methods, i.e. method 1 and method 2 and they are expressed as:

$$Io1 = \frac{I_B}{2} + gm,\max\frac{V_{id}}{2} \qquad (19)$$

$$Io2 = \frac{I_B}{2} - gm,\max\frac{V_{id}}{2} \qquad (20)$$

Region II

Since $I_n = I_p = I_B$, and gmn=gmp=gm.max, (Io1, Io2) is either (Ip1',Ip2) or (In1,In2) for method 1, and either (Ip2', Ip1') or (In1',In2') in method 2. Therefore, the resulting currents (Io1, Io2) are equal to expressions (19) and (20), respectively.

Region III

The situation in this region is exactly the reverse of that in Region I, and if the subscripts n and p are interchanged, the expressions derived for Region I can be used in connection with Region III. Consequently, the same current forms as shown in expressions (19) and (20) obtain for both method 1 and method 2.

Figure 5:
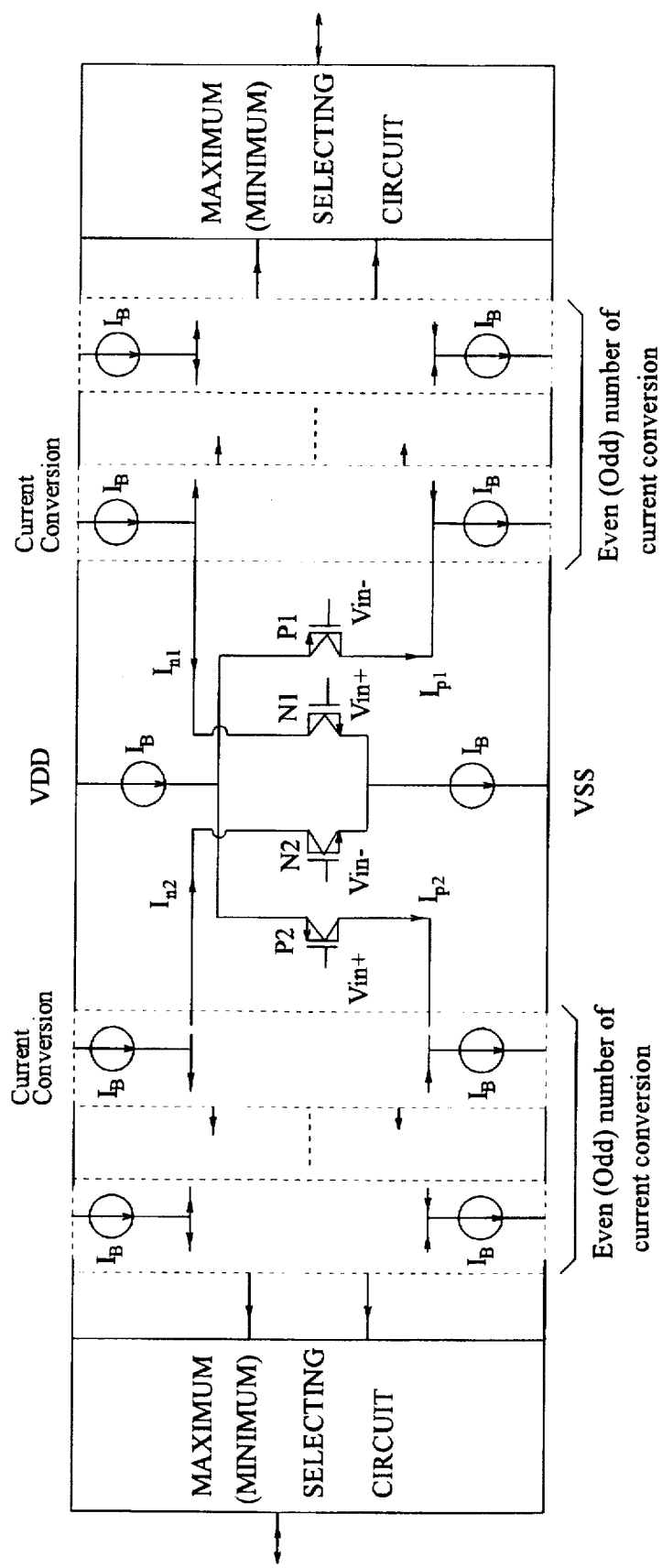
FIG. 5 is a schematic drawing generally portraying the utilization of maximum or minimum selecting circuits with respect to the number of current conversions carried out within a circuit.

In view of the foregoing, expressions (19) and (20) guarantee that gm is constant and equal to gm.max in the entire common mode input voltage range. This approach can be universally applied independently of the input transistor types and their operating regions. The currents Ip1, Ip2, In1, and In2 can be mirrored or copied and subtracted from a constant DC current more than one time. Looking momentarily to FIG. 5, there is depicted a generalized version of the total instantaneous case (TIC) in connection with current conversion or redirecting circuits. In this regard, a maximum amplitude selecting circuit may be used to achieve constant transconductance with the utilization of an even number of current conversion stages while a minimum selecting circuit can be used after an odd number of current conversion stages.

Circuit Implementation

The circuit implementation of the invention which will involve functions of subtraction and selection of maximum and minimum signal values may be developed through the utilization of current mirror or current redirecting circuits which may take on a variety of configurations. The characteristics of these mirror circuits which are taken advantage of are their features of reversing current direction and a structuring wherein, for a particular topology, current may only flow into the circuits to effect their operation or flow out of them depending upon component selection. For a further discussion concerning these circuits, reference is made to the following publications:

T. Yamakawa and T. Miki, "The current mode fuzzy logic integrated circuit fabrication by the standard CMOS process," IEEE Transactions on Computers, vol. c-35, pp. 161–167, 1986.

E. A. Vittoz, "Analog VLSI Signal Processing: Why, Where, and How," Analog Integrated Circuits and Signal Processing, vol. 6, No. 1, pp. 27–44, July 1994.

Figure 6B:
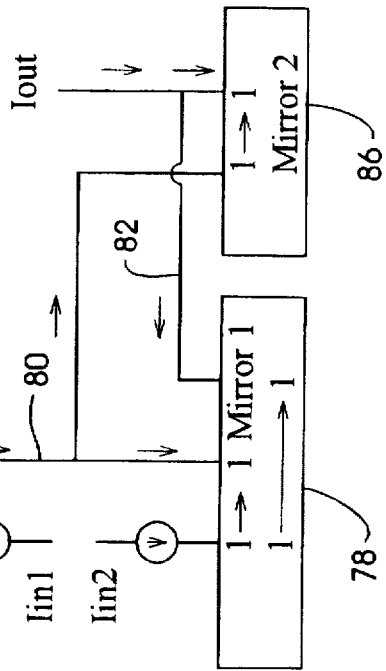
FIGS. 6A–6D show block diagrams of a Max-circuits for different directions of input and output currents.
Figure 6D:
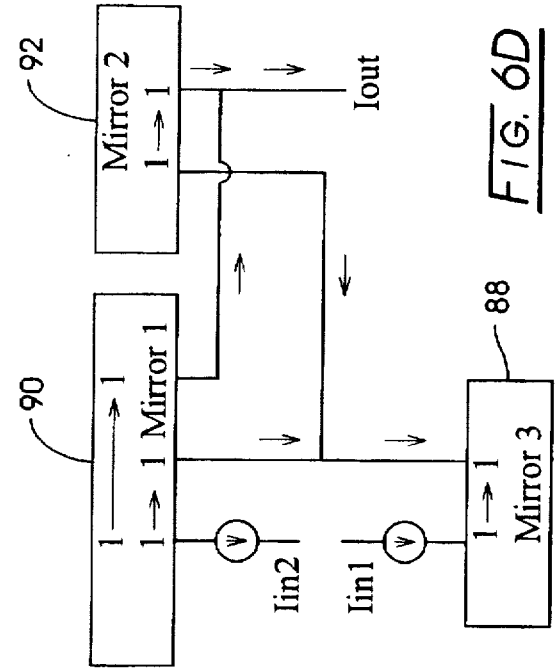
Figure 6A:
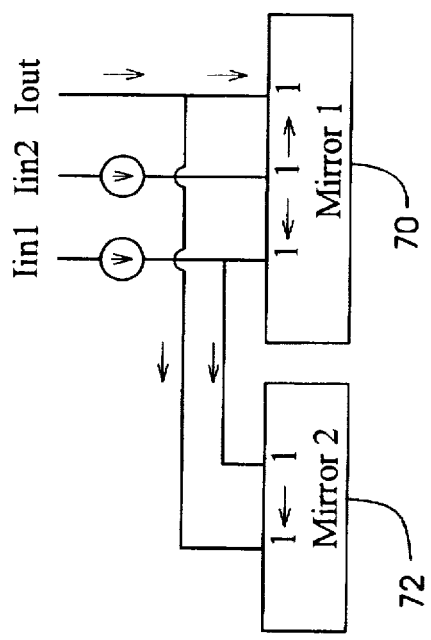
Figure 6C:
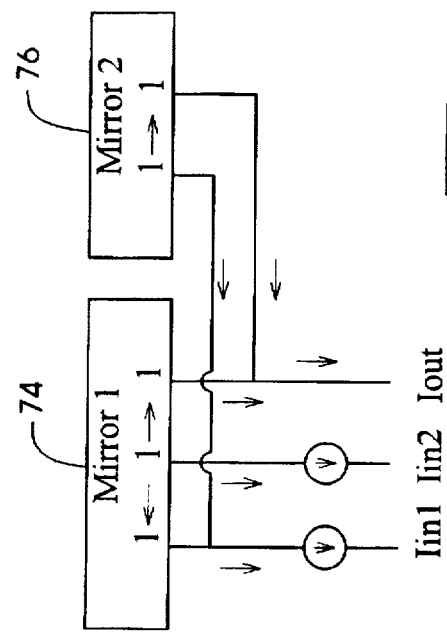

FIGS. 6A–6D are block diagrams of embodiments for a maximum selecting circuit (Max-circuit). Of these embodiments, FIG. 6A depicts an arrangement where output current is incoming, whereas, FIG. 6C depicts an arrangement where output current is outgoing. Correspondingly, FIGS. 6B and 6D illustrate circuit embodiments wherein the output currents are incoming and outgoing respectively, and one of the input currents is incoming while the other is outgoing, an arrangement described, for example, in connection with FIG. 4 wherein the variables In1', In2', and Ip1', Ip2' are considered. The circuit of FIG. 6A determines a maximum of the two input currents Iin1, Iin2. The maximum of these two will be present at Iout. Note that the two input signals are directed to minor circuit 1 represented at block 70. Circuit 70 functions to copy input Iin2 at a one-to-one ratio to two locations or branches, to wit, the output, Iout, and to the Iin1 input. The latter copying evokes the difference between the two input currents, namely Iin1-Iin2. If Iin1>Iin2, this current difference flows to current mirror 2 shown at block 72, and a copy of that difference will be added at the output. Thus, the output will be represented as Iin2+(Iin1-Iin2), or Iin1. Where the two values are equal, the output remains as Iin2 at the output and where Iin1 is less than Iin2, the current directed to mirror 2 at block 72 is reversed such that mirror circuit 2 at block 72 will cease to operate. Thus, the output is equal to Iin2. In all cases, the output current is equal to MAX(Iin1, Iin2). With the arrangement, current mirror 2 functions to reverse the current direction and only works when the current flows into it in consequence of its noted unidirectional architecture.

Looking to FIG. 6C, the same MAX selection arrangement as depicted in connection with FIG. 6A is presented. However, for this embodiment, the input currents as well as output current are reversed in the sense of FIG. 6A and are shown coupled with current mirror circuit 1 as represented at block 74. As before, the current input designated as Iin2 is copied both to variable Iin1 and Iout. This provides for submitting the earlier-noted difference, Iin1-Iin2 to current mirror circuit 2 shown at block 76. As before, where the value of variable Iin1>Iin2, then that difference is copied to mirror circuit 2 at block 76 and the difference is redirected to the output, Iout as an addition to the earlier copied variable Iin2 to provide Iin1 at the output of Max-circuit. Where the variable Iin2>Iin1, then mirror circuit 2 at block 76 will cease to operate due to its directionality and Iout will equal Iin2.

Now looking to FIG. 6B, input currents or variables Iin1 and Iin2 are seen to be in opposite directions, considering some device to be interposed between them. With the arrangement shown, variable or current Iin2 is directed to mirror circuit 1 as seen at block 78 and is copied to mirror circuit positions or branches represented at lines 80 and 82. Input current or variable Iin1, on the other hand, is coupled to a current mirror circuit 3 represented at block 84 which functions to reverse its direction and resubmit it at line 80 to current mirror circuit 1 at block 78. This provides for the directing of the earlier-noted difference Iin1-Iin2 to current mirror circuit 2 as represented at block 86. Thus, as before, the output at mirror circuit 2 at block 86 is a combination of the variable current Iin2 plus the difference between currents Iin1 and Iin2. For the condition where the current variable Iin1>Iin2, then the difference Iin1-Iin2 will have been copied to mirror circuit 2 at block 86 and presented to the output.

FIG. 6D performs in the same manner as the arrangement of FIG. 6B. As before, current variable Iin1 is copied at current mirror circuit 3 shown at block 88 while variable Iin2 is copied twice at mirror circuit 1 as represented at block 90 and the outputs are developed at current minor circuit 2 as represented at block 92.

Referring to FIGS. 7, the Max circuits discussed in connection with FIGS. 6A and 6C are shown implemented as type NMOS at FIG. 7A; type PMOS at FIG. 7B; type npn in FIG. 7C; and type pnp at FIG. 7D. In general, as may be observed from circuits of FIG. 7, a mirror circuit is one wherein, for example in MOS technology, the transistors such as N1, N2 are coupled in parallel having common gate connections and common source connections. Additionally, the gate of one transistor is coupled to its drain. Thus, current flowing at one transistor will be copied to the other transistor. The same general arrangement applies in connection with Bipolar devices, however in the latter case, the base of a Bipolar transistor is not isolated with the result that a small amount of current will flow through it. This will be seen to be accommodated for in the circuits of the present invention.

Figure 7B:
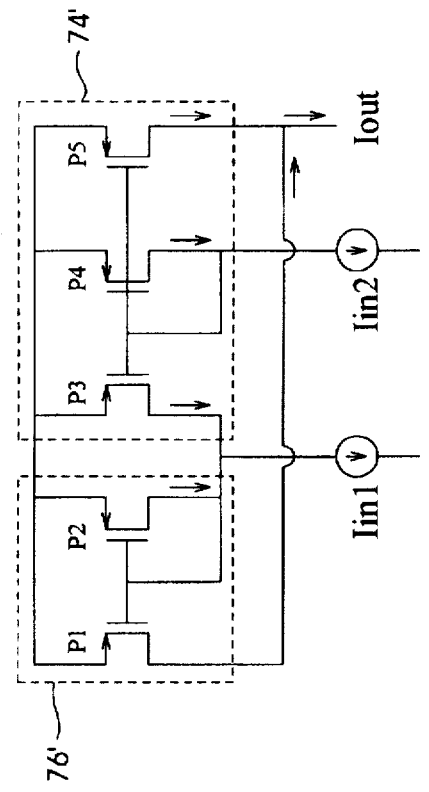
FIGS. 7A–7D show Max-circuits respectively of NMOS, PMOS, npn-Bipolar, and pnp-Bipolar types.
Figure 7D:
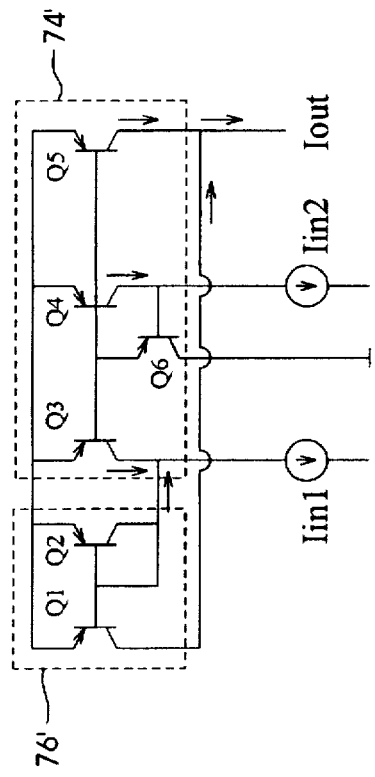
Figure 7A:
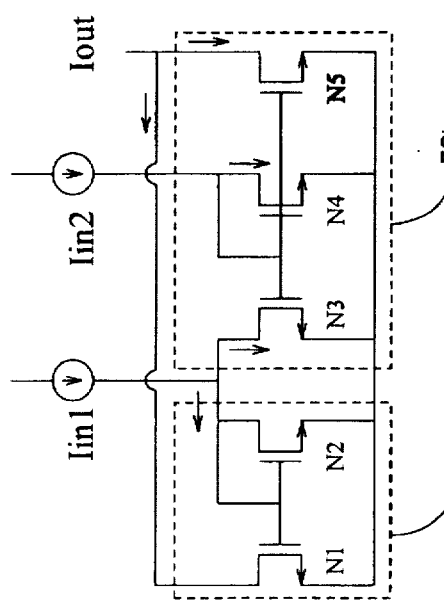

FIG. 7A shows transistors N3, N4 and N5 having common gate connections and coupled mutually in parallel to define a mirror circuit 1 as earlier described in connection with block 70 in FIG. 6A. That block is shown as a dashed boundary 70' in the instant figure. In similar fashion, transistors N1 and N2 are arranged to define mirror circuit 2 as earlier described at block 72 in FIG. 6A and shown herein as a dashed boundary 72' with the same numeration.

Looking to FIG. 7B, the PMOS implementation shows mirror circuit 1 as described earlier at block 74 in connection with FIG. 6C as comprised of transistors P3, P4 and P5. The arrangement is shown enclosed in a dashed boundary at 74'. The corresponding mirror circuit 2 as described in connection with FIG. 6C at block 76 is shown formed of transistors P1 and P2 identified within dashed boundary 76'.

Figure 7C:
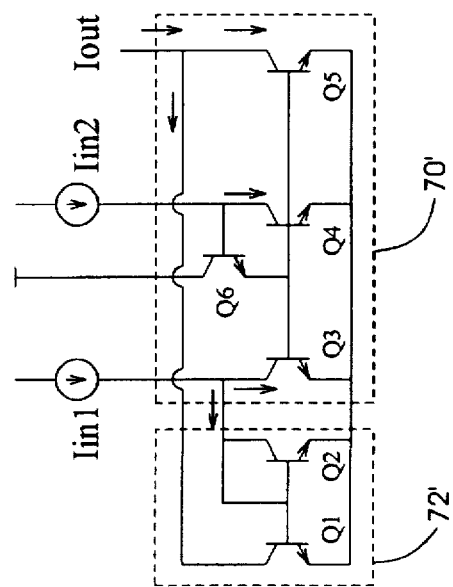

Looking to FIG. 7C, the npn implementation of the circuit of FIG. 6A is illustrated. In this regard, mirror circuit 1 earlier described at block 70 is shown within a dashed boundary at 70' and is formed of npn transistors Q3, Q4, and Q5. Current mirror 70' also incorporates a buffer transistor Q6 for the purpose of reducing error contributed by the above-noted base currents. Where the mirror circuit as at 70' incorporates three transistors, then such error correction becomes quite helpful. In this regard, the more transistors which are employed, the higher the error level will become. With the arrangement shown, the emitter of transistor Q6 is coupled to the common base coupling of the mirror circuit while its collector is coupled to supply and its base is connected to the collector of transistor Q4. Mirror circuit 2 earlier described at block 72 is seen to be implemented with transistors Q1 and Q2 and is identified again with the same primed numeration in phantom in the instant figure.

Looking to FIG. 7D, the pnp implementation of the circuit of FIG. 6C is revealed. Mirror circuit I earlier described at block 74 is seen to be implemented by transistors Q3, Q4, and Q5 along with correction transistor Q6. That circuit is shown within a dashed boundary 74'. In similar fashion, mirror circuit 2 earlier described at block 76 is shown to be comprised of transistors Q1 and Q2, and is identified within the dashed boundary shown at 76'. Transistor Q6 carries out the same base current correction function described in connection with FIG. 7C.

Figure 8A:
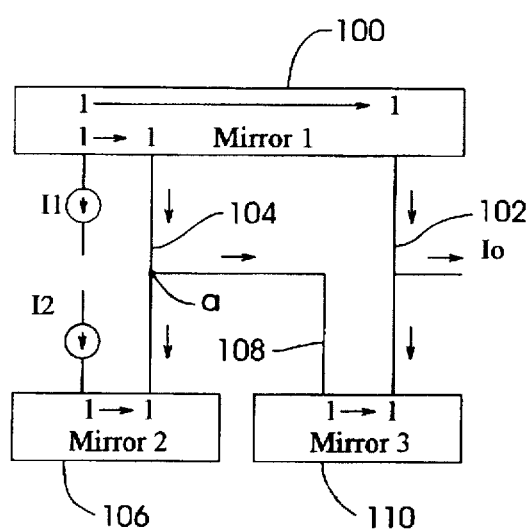
FIGS. 8A–8D show current mode Min-circuits of outgoing and incoming types.
Figure 8B:
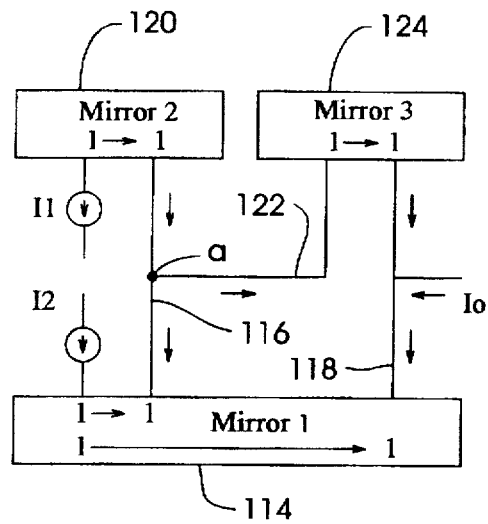
Figure 8C:
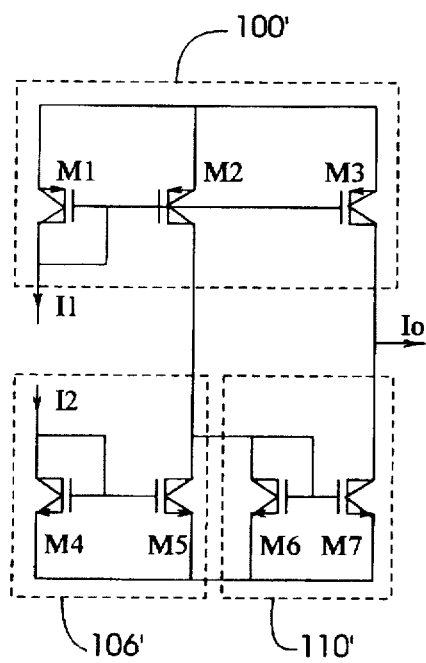
Figure 8D:
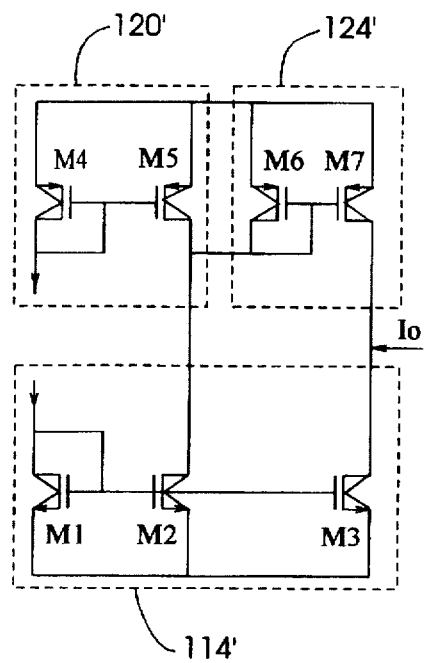

Referring to FIGS. 8A to 8D, configurations for current mode minimum current selecting circuits are illustrated. These circuits receive two currents designated $I_1$ and $I_2$ and generate Min[$I_1$,$I_2$] as an output current. Depending upon the output current direction, two types of these Min-circuits are depicted, FIG. 8A showing an outgoing type and FIG. 8B showing an incoming type. FIGS. 8C and 8D are the circuit implementations of respective FIGS. 8A and 8B utilizing the universal symbolism as earlier presented. As discussed above, these Min-circuits are employed where a combined AC and DC variable is involved.

In FIG. 8A, a Min-circuit for outgoing current is seen to incorporate a mirror 1 circuit represented at block 100. Input $I_1$ is connected with the circuit at block 100 and is copied to the output branch represented at line 102 as well as to an intermediate branch represented at line 104. Mirror circuit 2 as seen at block 106 receives the second input $I_2$ and copies it to a branch additionally coupled to line 104, its direction now being reversed. Line 104 is connected with a line 108 at node a. Line 108, in turn, is directed to the input of mirror circuit 3 as represented at block 110 and that input from line 108 is copied to a branch at the output represented at line 102. With the arrangement shown, at node a, the possible current at line 108 will correspond with the value $I_1-I_2$. On the occasion that the current $I_1$>current $I_2$, the signal at line 104 will be directed as shown by the arrow to mirror circuit 3. Under the noted condition that $I_1$ is the larger current, it is a maximum value. With such signal routing, the output $I_o$ will equal $I_1-(I_1-I_2)$ which is equal to the minimum signal value $I_2$. For a condition where the variable $I_2$>$I_1$, the variable at line 108 will be in an opposite direction, thus being rejected at mirror circuit 3 at block 110 and providing the variable Ii as the output $I_o$.

The same arrangement is provided with an incoming output current type Min-circuit represented at FIG. 8B. In that figure, mirror 1 is represented at block 114 having one branch coupled with current variable $I_2$ which is copied to the branch at line 116 as well as to the output as represented at line 118. Correspondingly, the current variable $I_1$ is directed to mirror circuit 2 represented at block 120 where it is copied and reversed to be presented at line 116 and node a. Node a is seen coupled via line 122 to mirror circuit 3 represented at block 124. As before, the difference between the two variables $I_1$ and $I_2$ is presented to mirror circuit 3 at block 124, whereupon it is reversed and copied to the output as represented at line 118. The same selection of Min value with respect to variables $I_1$ and $I_2$ is developed as described in connection with FIG. 8A.

FIG. 8C shows the universal component implementation of the circuit of FIG. 8A. In this regard, mirror circuit 1 as described at block 100 again is shown in a dashed boundary 100' and is seen to be comprised of transistors M1, M2, and M3. In similar fashion, mirror circuit 2 as described in connection with FIG. 8A at block 106 is shown within a dashed boundary having that identifying but primed numeration and which is comprised of transistor components M4 and M5. Lastly, mirror circuit 3 as described at block 110 is shown within dashed boundary 110' in FIG. 8C and is formed of transistor components M6 and M7.

FIG. 8D is the implementation of the circuit described in connection with FIG. 8B. In this regard, mirror circuit 1 earlier described at block 114 is shown within dashed boundary 114' and is seen to comprise transistor components M1, M2, and M3. Mirror circuit 2 as described in conjunction with block 120 in FIG. 8B is represented by the same but primed numeration in conjunction with a dashed boundary and is seen to be formed of transistor components M4 and M5, while minor circuit 3, earlier described in conjunction with block 124, is represented within a dashed boundary with that same but primed numeration and is formed of transistor components M6 and M7.

The Constant Transconductance Input Stage

A. Realization—Finding the Max AC Signal, (Case A)

Figure 9A:
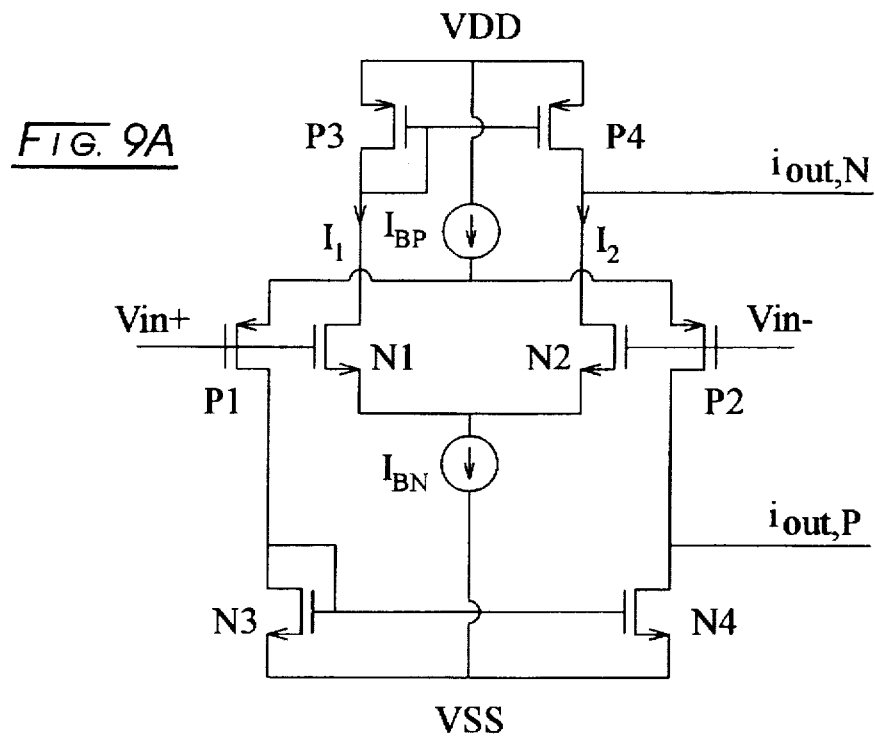
FIG. 9A is a schematic representation of a complementary differential input stage with active load and incorporating two subtractive mirror circuit functions.

Referring to FIG. 9A, a simple CMOS complementary input stage is depicted. If the body effect is ignored, the input common mode voltage range of this input stage is limited to:

$$Vcm,\min = V_{SS} + \sqrt{\frac{I_{BP}}{k'n}\left(\frac{L}{W}\right)_{N3,N4}} + V_{Tn} - |V_{tp}| \quad (21)$$

where $k'n=\mu_n C_{ox}$ and $$Vcm,\max = V_{DD} - \sqrt{\frac{I_{BN}}{k'p}\left(\frac{L}{W}\right)_{P3,P4}} + V_{Tn} - |V_{tp}|, \quad (22)$$

where $k'_p=\mu_p C_{ox}$

Figure 10A:
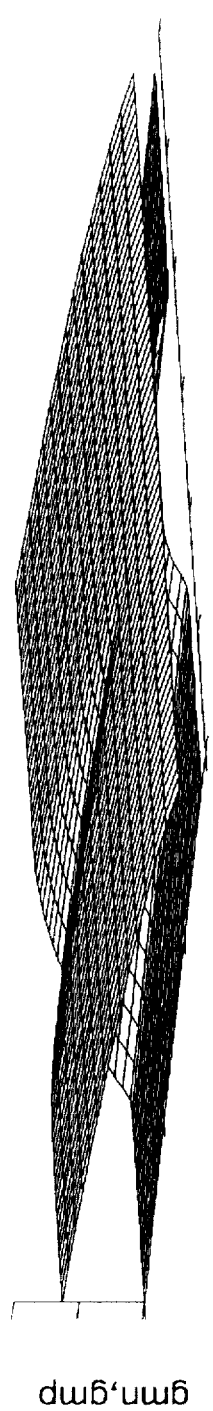
FIGS. 10A–10C combine to show normalized associations of grim and gmp of an input stage as a function of common mode input voltage and bias current.
Figure 10B:
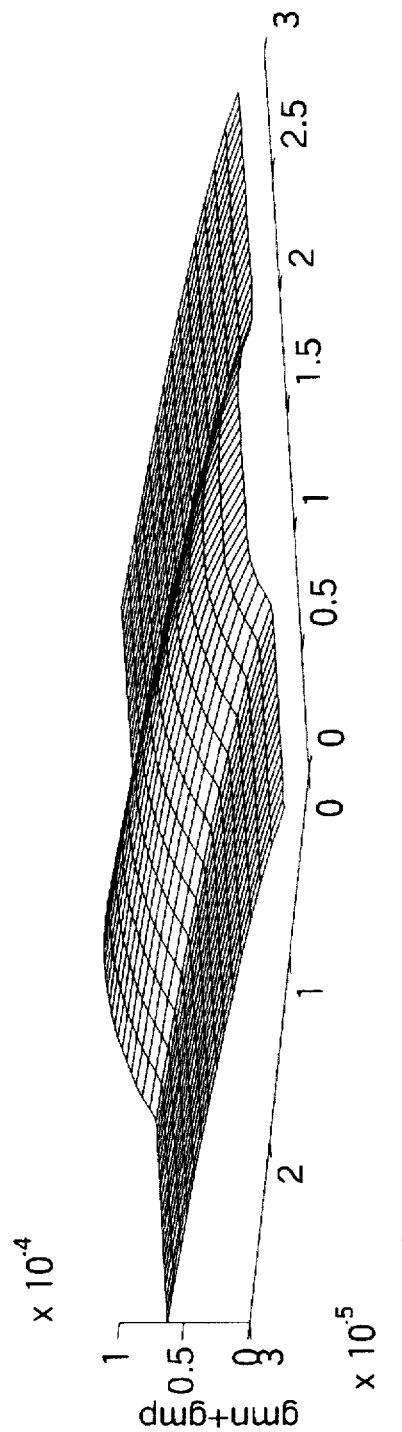
Figure 10C:
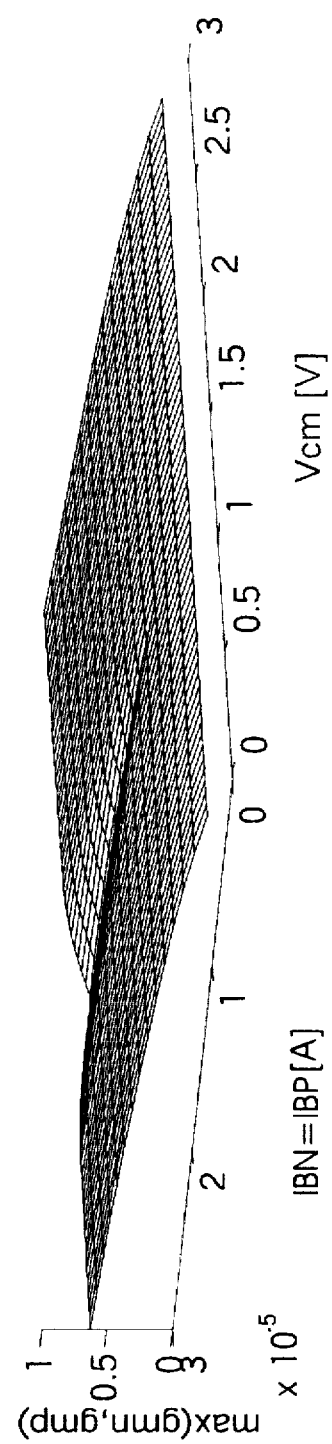

Therefore, almost rail-to-rail operation can be achieved. However, to improve the common mode input voltage range and thereby achieve full nil-to-rail input voltage range, a folded cascode configuration for the input stage may be used. FIG. 10A shows the variations of the normalized input stage transconductance defined as:

$$gmn, \text{NORM} = \frac{gmn}{\sqrt{k'n\left(\frac{W}{L}\right)_n}} \quad (23)$$

$$gmn, \text{NORM} = \frac{gmp}{\sqrt{k'p\left(\frac{W}{L}\right)_p}} \quad (24)$$

as a function of bias current and common mode input voltage. In this regard, the transconductance is represented along a z axis, while bias current is represented along a y axis, and common mode voltage is represented along an x axis. If the input complementary differential pairs have an overlapping constant gm region, a constant gm can be obtained simply by picking the maximum gm at any given Vcm. To this end, a circuit is called for which compares the amplitudes of the signals at the outputs of the n-channel and p-channel differential pairs and redirects the largest one to the output. The Max-circuit discussed above can be used for this purpose. For input voltages close to the negative supply voltage, the p-channel differential pair has a larger gm and the Max-circuit will select the output current of this stage. As VCM increases, gmn increases while gmp decreases. At some voltage level, both the n-channel and p-channel differential pairs have the same gm and hence the signal currents at the inputs of the Max-circuit will be equal. However, this situation does not introduce any complications because the Max-circuit operates in a continuous manner and does not rely on switching certain transistors on or off to activate or deactivate a certain pair, as encountered in certain prior an or conventional techniques seeking to achieve a constant gm. For Vcm close to the positive supply, the output of the n-channel differential pair is dominantly larger than the output of the p-channel differential pair. As a result, the signal at the output of the Max-circuit would be equal to the output signal of the n-channel differential pair.

Figure 9B:
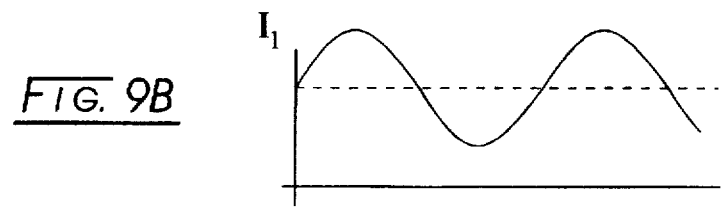
FIGS. 9B–9E show schematic waveforms illustrating the general performance of the input stage of FIG. 9A.
Figure 9C:
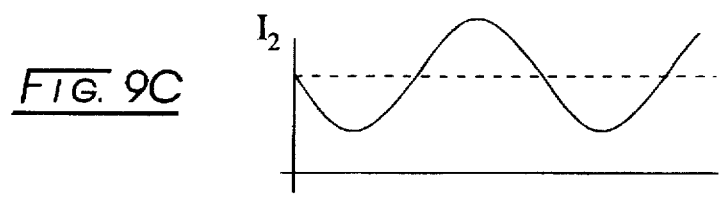
Figure 9D:
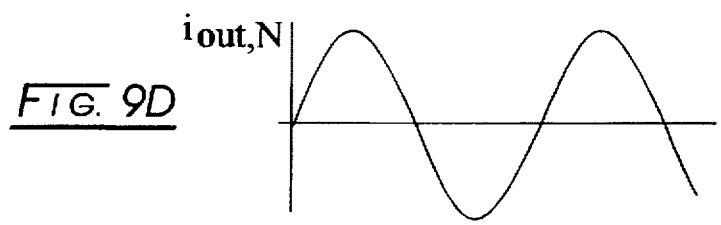
Figure 9E:
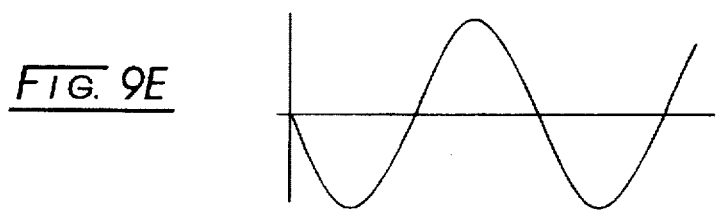

Returning to FIG. 9A, considering or focusing upon the inner complementary pair of this stage as at N1, N2, in general, the current at the drain terminals of this differential pair may be represented, respectively, as I1, I2 as shown in the figure. Looking additionally to FIGS. 9B and 9C, current variables I1 and I2 may be seen to carry an AC signal superimposed upon a DC term. Note, additionally, that the two variables are 180° out of phase. In accordance with Case A, it is desirable to eliminate the DC term and this may be carded out by subtracting the I1, I2 current variables which results in an output, designated $i_{out,N}$, wherein the DC term disappears and the amplitude of the AC or information carrying signal is doubled. This is represented in FIG. 9D and corresponds, for example, with $i_{out,N}$ in FIG. 9A, the subtraction having been carried out with a mirror circuit incorporating transistors P3 and P4. A similar performance is achieved with the outer complementary pair P1 and P2 providing an output $i_{out,P}$. On the other hand, if current variable I1 is subtracted from current variable I2, the AC signal shown in FIG. 9E will be realized, a signal 180° out of phase with respect to the current variable $i_{out}N$.

Figure 11:
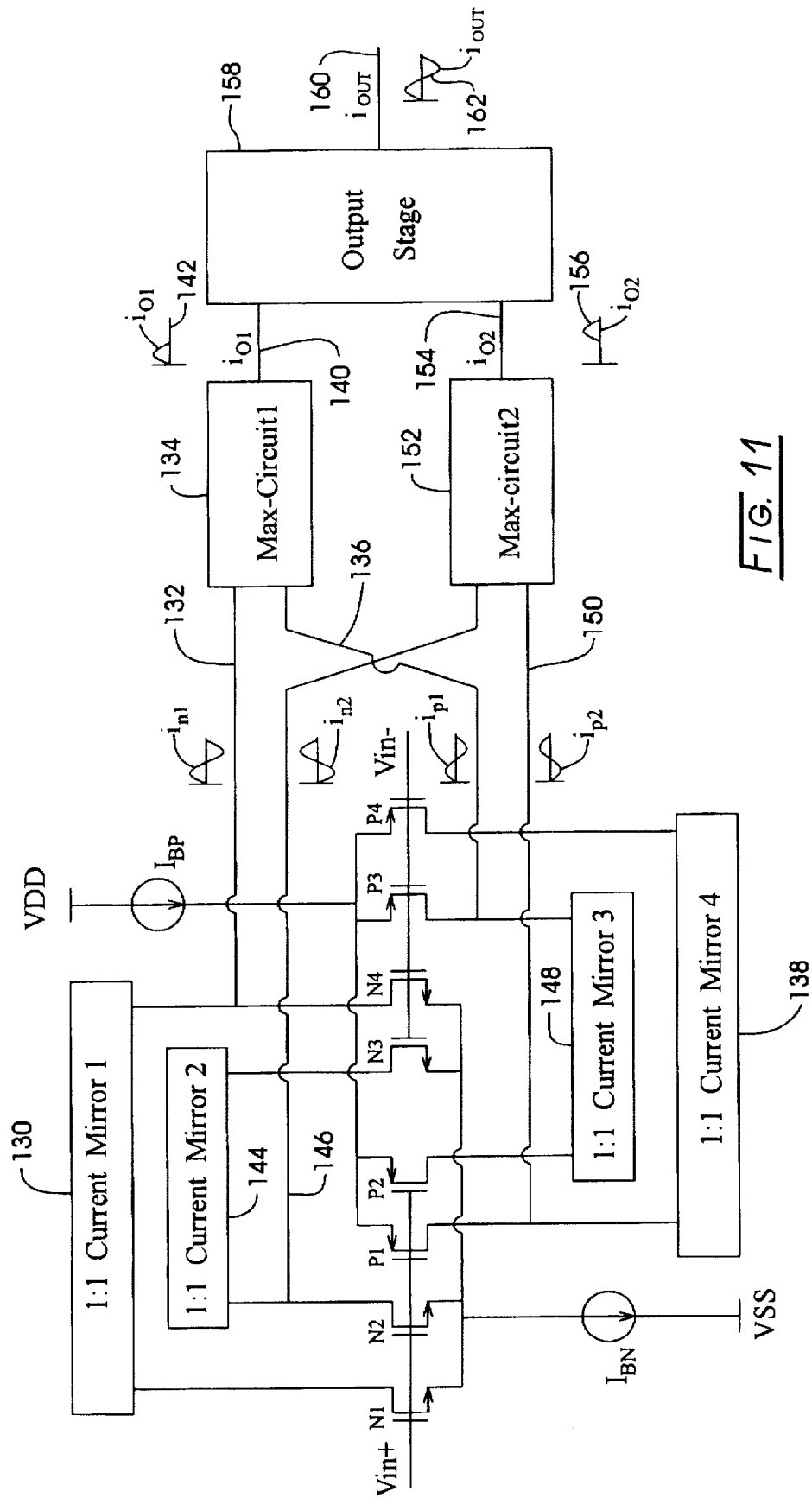
FIG. 11 is a simplified circuit diagram of a low voltage operational amplifier using Max-circuits in accordance with the invention.

Referring to FIG. 11, a simplified circuit diagram (gain stage 44 is included in output stage 158) of a low voltage operational amplifier using the Max-circuit approach in an implementation based upon Case A is provided. The circuit of FIG. 11 develops the AC or information signal by carrying out a subtraction process as discussed in conjunction with FIGS. 9A to 9E. In this regard, a one-to-one Current Mirror 1 as represented at block 130 is provided which is coupled to respond to the drain currents of transistors N1 and N4. The resultant output is represented as a sinewave at line 132 which is presented to one input of a Max-circuit 1 represented at block 134. Such Max-circuits have been described above in conjunction, for example, with FIG. 7A. The output may be represented as a sine curve in1 shown adjacent line 132. Correspondingly, the second input to Max-circuit 134 is from line 136 and Current Mirror 3 as represented at block 148. Current Mirror 3 functions in the manner of FIG. 9A to subtract the drain currents of transistors P2 and P3. Its AC signal output is represented in the figure as the curve $i_{p1}$, which is seen to be in phase with the signal represented by curve $i_{n1}$. Max-circuit 1 at 134 is unidirectional as discussed above and provides an output designated io, at line 140. In this regard, looking to the $i_{o1}$ curve at 142, it may be observed that the circuit 134, being unidirectional, will respond to only select the positive-going component of variables $i_{n1}$ and $i_{p1}$. This result leads to the utilization of additional stages in the instant circuit. For example, Current Mirror 2 shown at block 144 responds to subtract the drain currents of transistors N2 and N3. The resultant output is present at line 146 and is represented by the curve adjacent thereto identified as $i_{n2}$. Note that the signal $i_{n2}$ differs 180° in phase with respect to the variable $i_{n1}$. Finally, Current Mirror 4 as represented at block 138 functions to monitor the additional transistor stages P2 and P4, and to carry out a subtraction of their drain currents to present a signal corresponding therewith at line 150. This AC signal variable is represented as curve $i_{p2}$ which is seen to be 180° differing in phase with respect to the signal $i_{p1}$. The AC variables $i_{n1}$ and $i_{p2}$ are directed via respective lines 146 and 150 to a Max-circuit 2 represented at block 152. The output of this max selecting circuit is present at line 154 and is designated as $i_{o2}$. This signal may be represented by the curve 156 located adjacent line 154. It may be observed that the curve 156 shows only positive going components of the input to circuit 152 and it is characterized in being displaced 180° in phase with respect to curve 142 or the signal ion. A consideration of output signal curves Io1 and Io2 shows that the Max-circuits 134 and 152 each respond only to the positive going half of each cycle asserted to them. In this regard, both the n-type and p-type Max-circuits shown in FIGS. 7A–7D are unidirectional. The n-type realization operates only when the currents are flowing into the circuit while the p-type realization operates when the currents are flowing out of the circuit. Thus, the bi-directional operation described in connection with FIG. 11 is achieved by using two n-type, two p-type, or a combination of one n-type and one p-type Max-circuit. A resultant max signal can be reassembled through the subtraction of the signals, a procedure carried out at a subtractive output stage represented at block 158 to present a maximum AC output signal designated as iout at line 160 which is represented at curve 162. From the foregoing, it may be observed that by utilizing extra stages, i.e. four differential paired transistors instead of two differential stages, the positive going components $i_{n1}$ and $i_{p1}$ can be asserted to one Max-circuit and $i_{n2}$ and $i_{p2}$ to another Max-circuit following which through a subtractive process, selected max output is generated.

Figure 12:
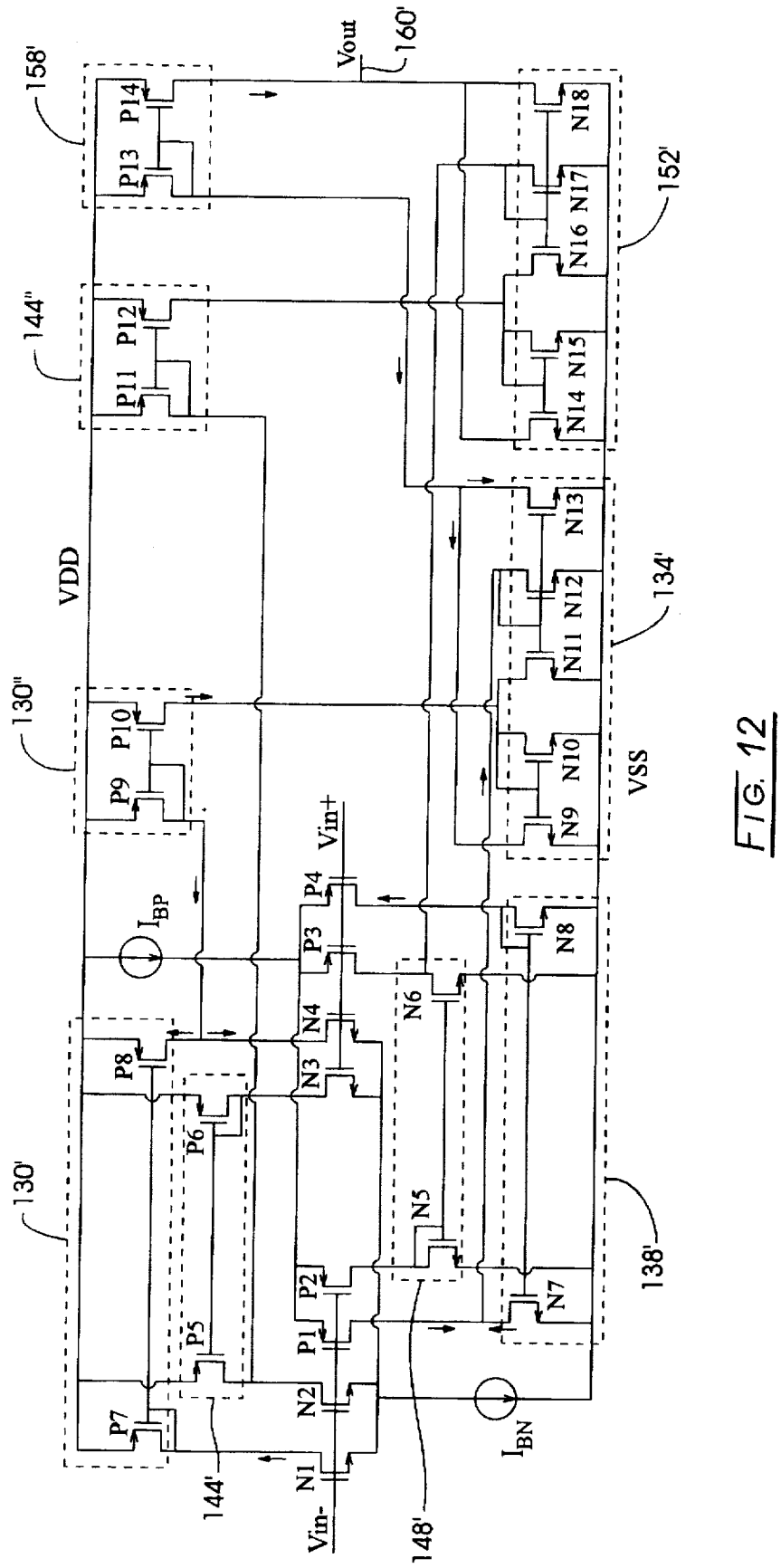
FIG. 12 is an electrical schematic implementation of the circuit of FIG. 11.

Referring to FIG. 12, the circuit described above in connection with FIG. 11 is shown implemented in MOS technology.

Figure 13:
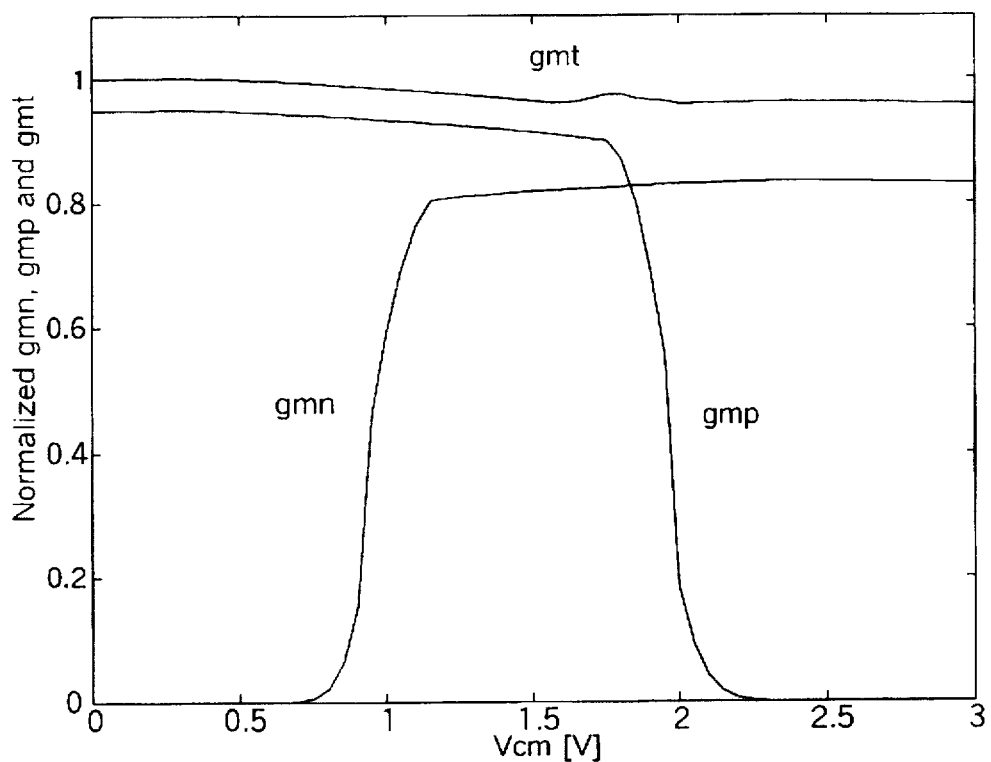
FIG. 13 is a graph showing a simulation result of the normalized transconductance of an MOS input stage according to the invention operating in strong inversion.

FIG. 12 shows the complete circuit diagram of the circuit described in general in connection with FIG. 11. In the figure, complementary pair stages incorporating the eight transistors N1–N4 and P1–P4 are reproduced, and the arrows on the figure show the direction of the AC currents when $v_{in}^+ > v_{in}^-$. Max-circuit 1 is shown incorporated within dashed boundary 134' and is seen to include transistor grouping N9—N13. Max-circuit 2 is shown incorporated within dashed boundary 152' and is formed of transistor grouping N14–N18. These Max-circuits have been described earlier, for example, in conjunction with FIG. 7(A). FIG. 12 further shows current mirror 1, earlier described at 130 in FIG. 11 to be present within dashed boundary 130' including transistors P7 and P8. This mirror circuit 130' is combined with an additional mirror circuit 130" to provide a current reversal leading to Max-circuit 134'. Mirror circuit 130' is seen to incorporate transistors P9 and P10. In similar fashion, current mirror circuit 144 is shown within dashed boundary 144' which includes transistors P5 and P6. The output of this mirror component is reversed utilizing an additional mirror circuit shown at 144" incorporating transistors P11 and P12. The output of the additional mirror circuit at 144" is directed to Max-circuit 152'. The outputs of the p-type differential stages are directed without the additional mirror stage to the Max-circuits. In this regard, Current Mirror 3 earlier described at block 148 is shown within dashed boundary 148' and includes transistors N5 and N6. Current mirror circuit 4 earlier described at block 138 is shown within dashed boundary 138' as including transistors N7 and N8. Finally, the subtracting output stage earlier described at block 158 is shown within dashed boundary 158' and includes transistors P13 and P14. The output of the circuit earlier described, at line 160 is shown in FIG. 12 at 160'. From the foregoing, it may be seen that the case A embodiment for an Op Amp utilizes an additional n-type and p-type input differential pair to generate the two 180° out-of-phase current signals required for bi-directional operation. Max-circuit 134' incorporating transistors N9–N13 responds when $v_{in}^+ > v_{in}^-$ and Max-circuit 152' comprised of transistors N14–N18 responds when $v_{in}^+ < v_{in}^-$. Due to the differential behavior of the input stage, all input currents to the Max-circuit are 0 when $v_{in}^+ = v_{in}^-$. The circuit of FIGS. 11 and 12 is not the only conceivable realization. For instance, instead of employing two n-type Max-circuits, a combination of an n-type and a p-type realization may be used. However, an n-type realization is preferred due to higher electron mobility and smaller area of n-channel transistors which gives rise to its superior performance at high frequencies. The simulation results of gmn, gmp, and $gm_t$ are shown in FIG. 13. This is normalized transconductance of the MOS input stage operating in strong inversion. This figure reveals that the total transconductance, $gm_t$, is highly satisfactory in terms of its constancy. The figure shows an error of only about 5%. While the reduction of error is of substantial advantage, the principal advantage of the circuits thus far described resides in the independency of the devices with which they are formed and the operational regions under which they perform. The architecture is capable of performing satisfactorily at very low current or weak inversion with the attendant advantage of low power consumption. Further, the circuits are not constrained to perform under a model or in accordance with preordained equations of performance. This is borne out by the simulations, for example, displayed hereinafter at FIGS. 14 and 19.

Figure 14:
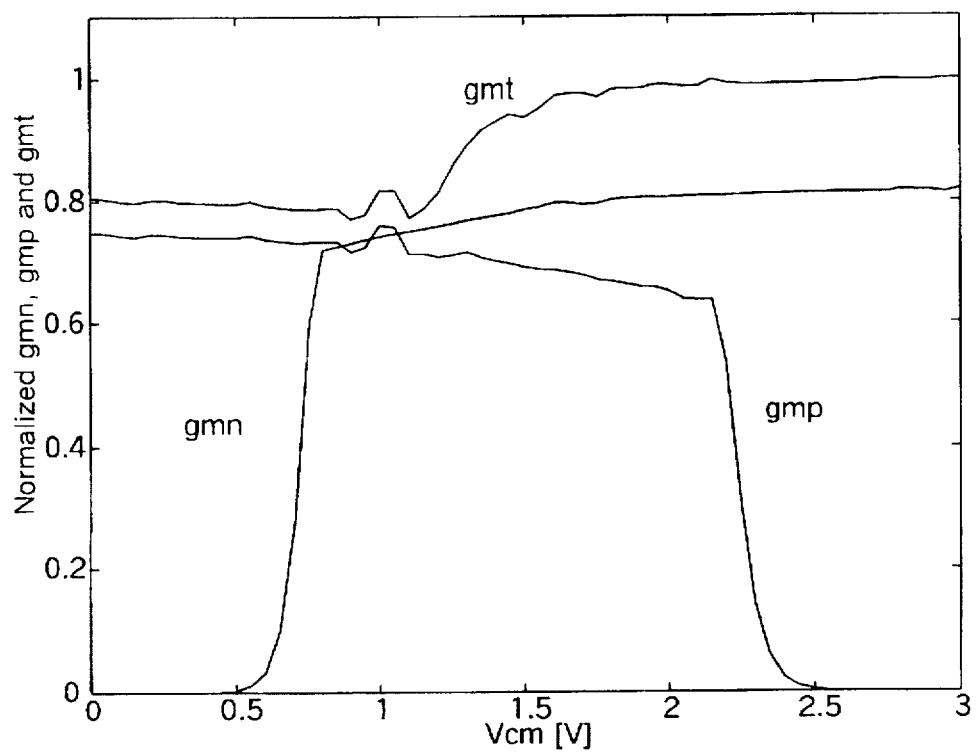
FIG. 14 is a graph showing a simulation result of the normalized transconductance of an MOS input stage according to the invention operating in weak inversion.
Figure 15:
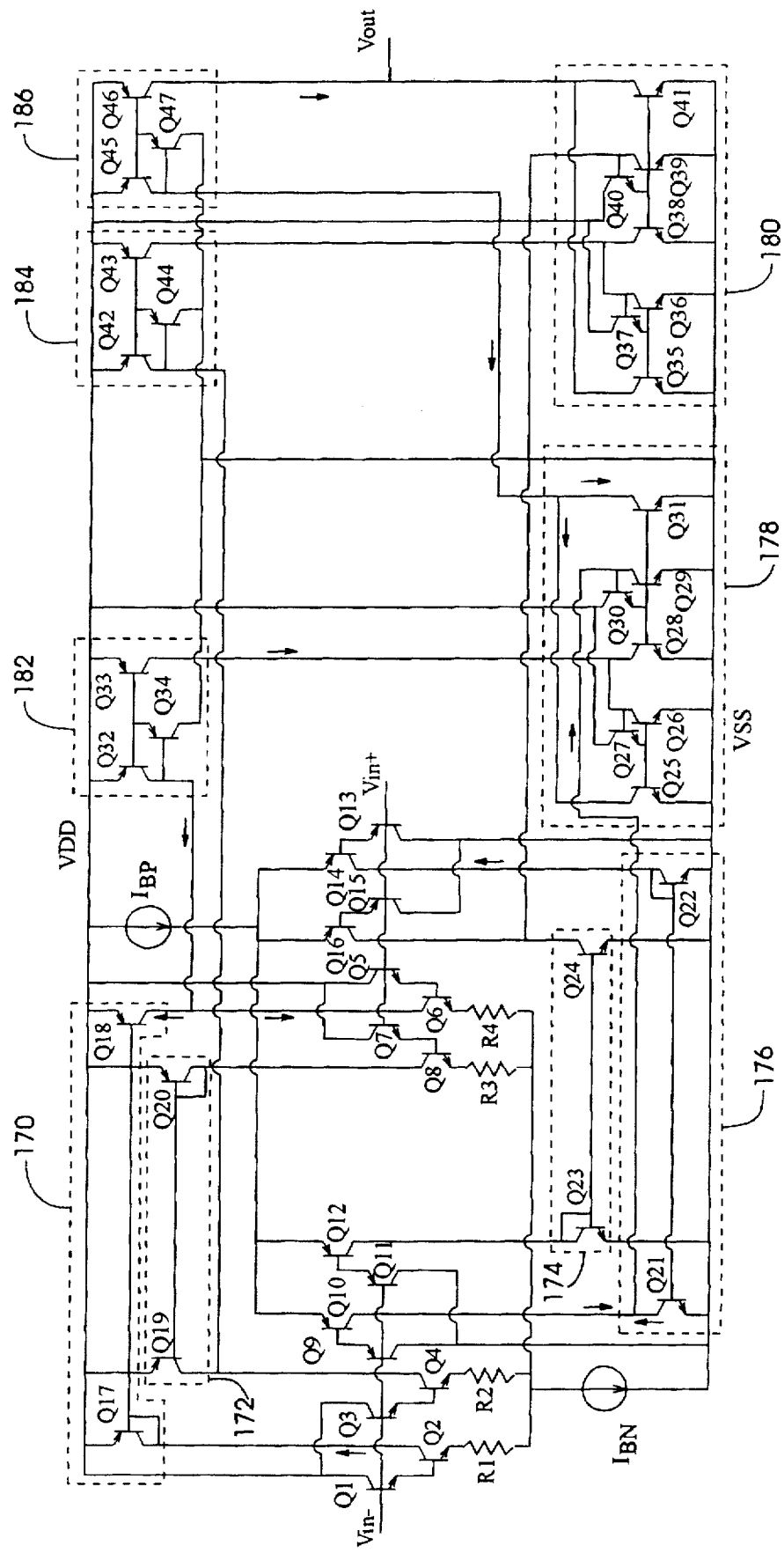
FIG. 15 shows a Bipolar transistor implementation of the circuit of FIG. 11.
Figure 16:
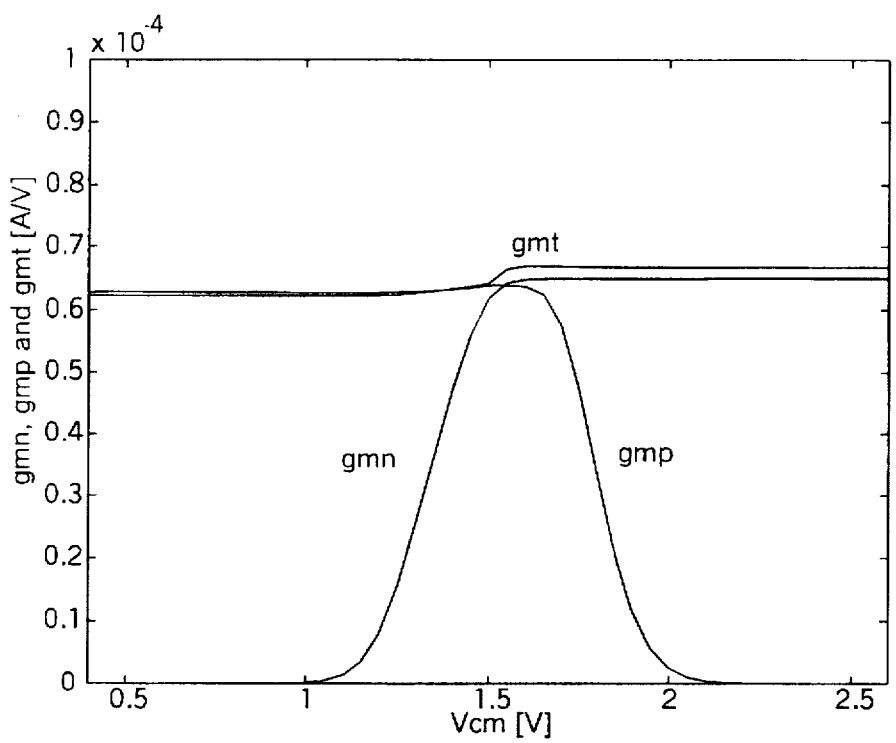
FIG. 16 is a graph showing a simulation result of the normalized transconductance of a Bipolar input stage according to the invention.

The adopted approach is quite versatile and can be extended to Bipolar input stage architecture as well as the MOS input stage architecture operating in weak inversion. FIG. 14 shows the simulation results of the circuit shown in FIG. 12 in weak inversion where the bias current is only 25 nA. The Bipolar implementation of this input stage is shown in FIG. 15, while the simulation of the Bipolar input stage transconductance is depicted in FIG. 16. In FIG. 15, wherein the arrows show the directions of the AC currents when $v_{in}^+ > v_{in}^-$, Current Mirror 1 corresponding in function with earlier-described current mirror 130 in FIG. 11 is shown as incorporating pnp transistors Q17 and Q18, within dashed boundary 170. This mirror circuit 170 carries out a subtractive role in conjunction with the outwardly disposed complementary stage components Q1, Q2, and Q5, Q6 which are shown in paired configurations. Such configurations serve to enhance the rail-to-rail performance of the differential stage. Current mirror circuit 2 is shown as including pnp transistors Q19 and Q20 within dashed boundary 172. This mirror circuit 172 carries out a subtractive function with respect to transistor stages Q3, Q4, and Q7, Q8. Current mirror 3 is shown to incorporate npn transistors Q23 and Q24 as seen within a dashed boundary 174 and function with transistor pairs Q11, Q12, and Q15, Q16. Finally, current mirror 4, functioning to carry out a subtraction function is seen comprised of npn transistors Q21 and Q22, and is enclosed within a dashed boundary 176. Transistors Q21 and Q22 are operationally associated with the collector currents of transistors Q9, Q10, and Q13, Q14.

The Max-circuit 1 implementation for the circuit of FIG. 15 will be seen to correspond with that described at FIG. 7C and is comprised of npn transistors Q25–Q31 which are enclosed within dashed boundary 178. Similarly, Max-circuit 2 is seen to be formed of npn transistors Q35–Q41, and is enclosed within dashed boundary 180, the circuit also corresponding with that described in connection with FIG. 7C. As in the case with the circuit of FIG. 12, a supplementary mirror circuit is provided in conjunction with Current Mirror 1 as shown within dashed boundary 182 to provide for a current reversal prior to introduction of the AC signal to Max-circuit 1 within dashed boundary 178. The supplementary current mirror circuit 182 incorporates transistors Q32–Q34. Similarly, a supplementary current mirror circuit is employed in conjunction with Max-circuit 2 within boundary 180 and is formed of pnp transistors Q42–Q44 which are seen within a dashed boundary 184. Finally, a subtraction stage corresponding with that described at block 158 is provided in the instant circuit as transistors Q45–Q47 which are located within a dashed boundary 186. A simulation of Bipolar input stage transconductance is depicted in FIG. 16.

Figure 18:
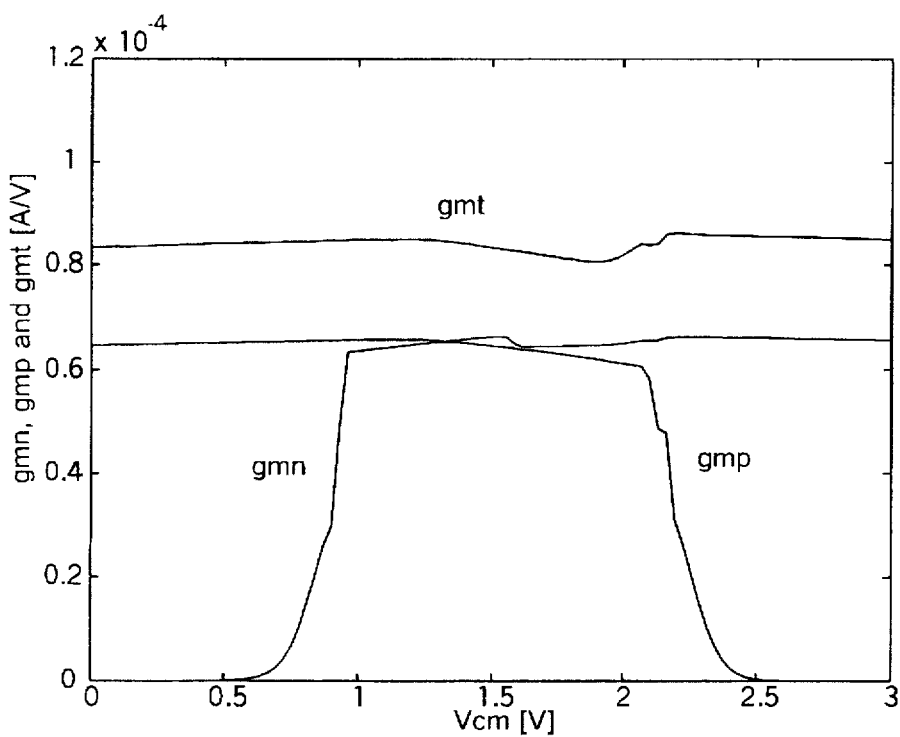
FIG. 18 is a graph showing a simulation result of the transconductance of the input stage shown in FIG. 17 in strong inversion.
Figure 17:
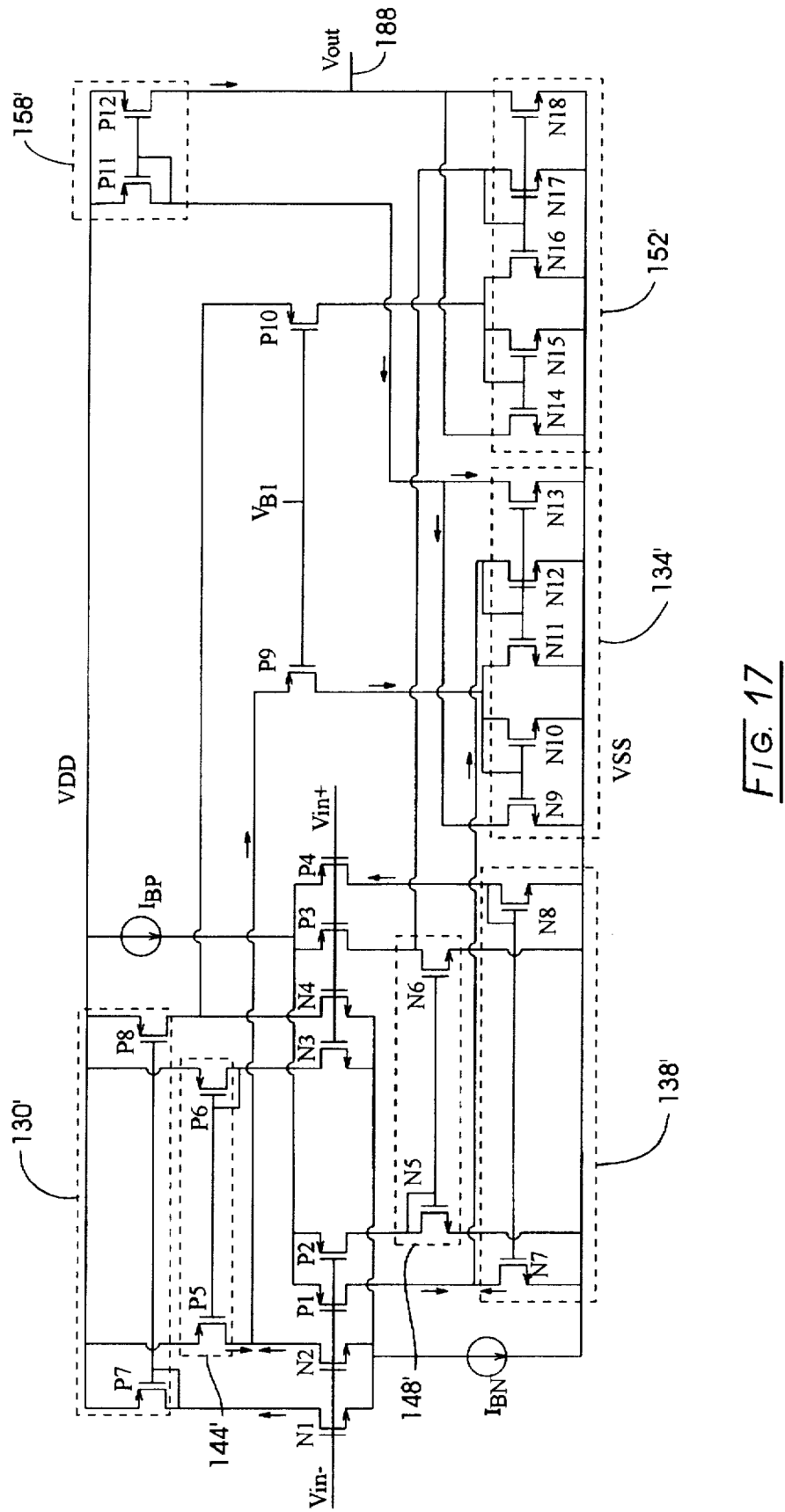
FIG. 17 shows an operational amplifier configured according to the invention using two n-type Max-circuits and two common gate stages.
Figure 19:
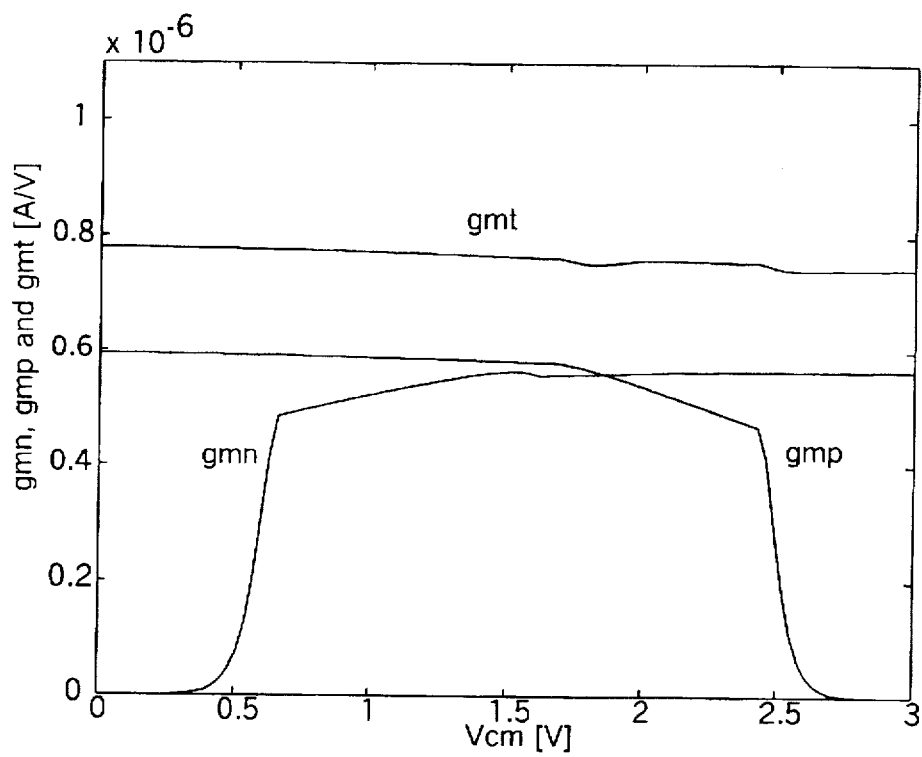
FIG. 19 is a graph showing a simulation result of the transconductance of the input stage shown in FIG. 17 in weak inversion.

Another variation of the input stage is shown in FIG. 17 where the arrows show the directions of AC currents when $v_{in}^+ > v_{in}^-$. In this circuit, instead of using two current mirrors earlier described at 130" and 144" in FIG. 12, the output of the n-type differential pair is coupled to the Max-circuit using two common gate stages which are identified in FIG. 17 as P9 and P10. With the latter exception, the circuit of FIG. 17 is the same as that shown in FIG. 12. In this regard, note that Current Mirror 1 again is shown to include transistors P7 and P8 and is incorporated within the dashed boundary 130'. Current Mirror 2 is shown to be formed of transistors P5 and P6, and is incorporated within a dashed boundary 144'. Current Mirror 3 is seen to include transistors N5 and N6 which are incorporated within a dashed boundary 148' and mirror circuit 4 incorporating transistors N7 and N8 is seen to be located within a dashed boundary 138'. Max-circuit 1 reappears in conjunction with transistors N9–N13 which, as before, are enclosed within a dashed boundary 134' and Max-circuit 2 is seen to be formed of transistors N14–N18 and, as before, is incorporated within dashed boundary 152'. The outer stage carrying out final subtraction again is incorporated within a dashed boundary 158' which includes transistors P11 and P12. The output of the circuit of FIG. 17, $V_{out}$ is seen at line 188. FIGS. 18 and 19 show the simulated transconductance of this circuit in strong and weak inversion, respectively.

B. Realization—Processing AC Signal Currents Superimposed on DC Tail Currents (Case B)

Figure 21:
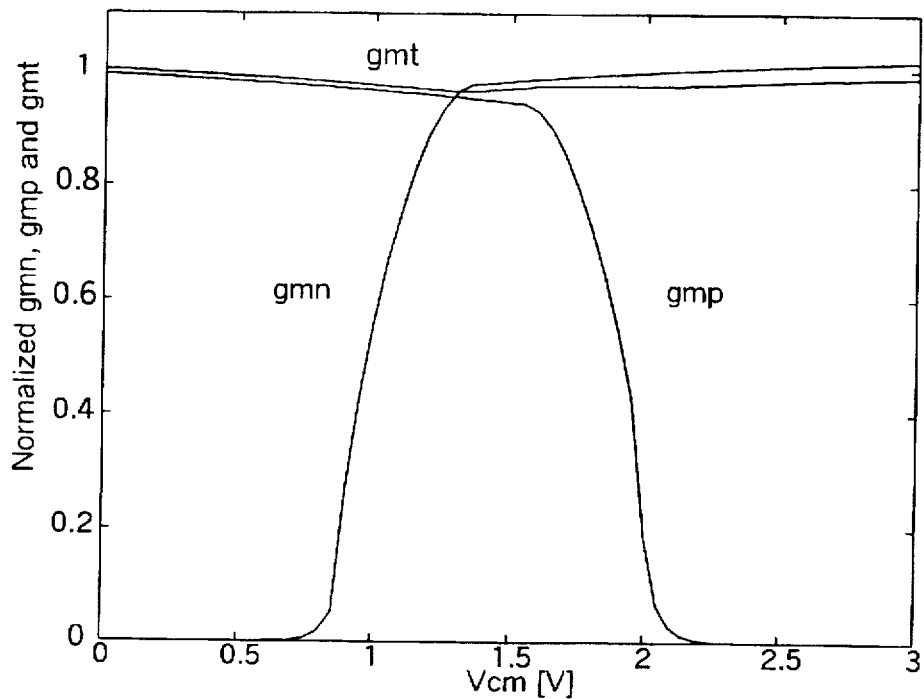
FIG. 21 is a graph showing a simulation result of the normalized transconductance of the stage of FIG. 20 implemented with MOS transistors operating in strong inversion.
Figure 20:
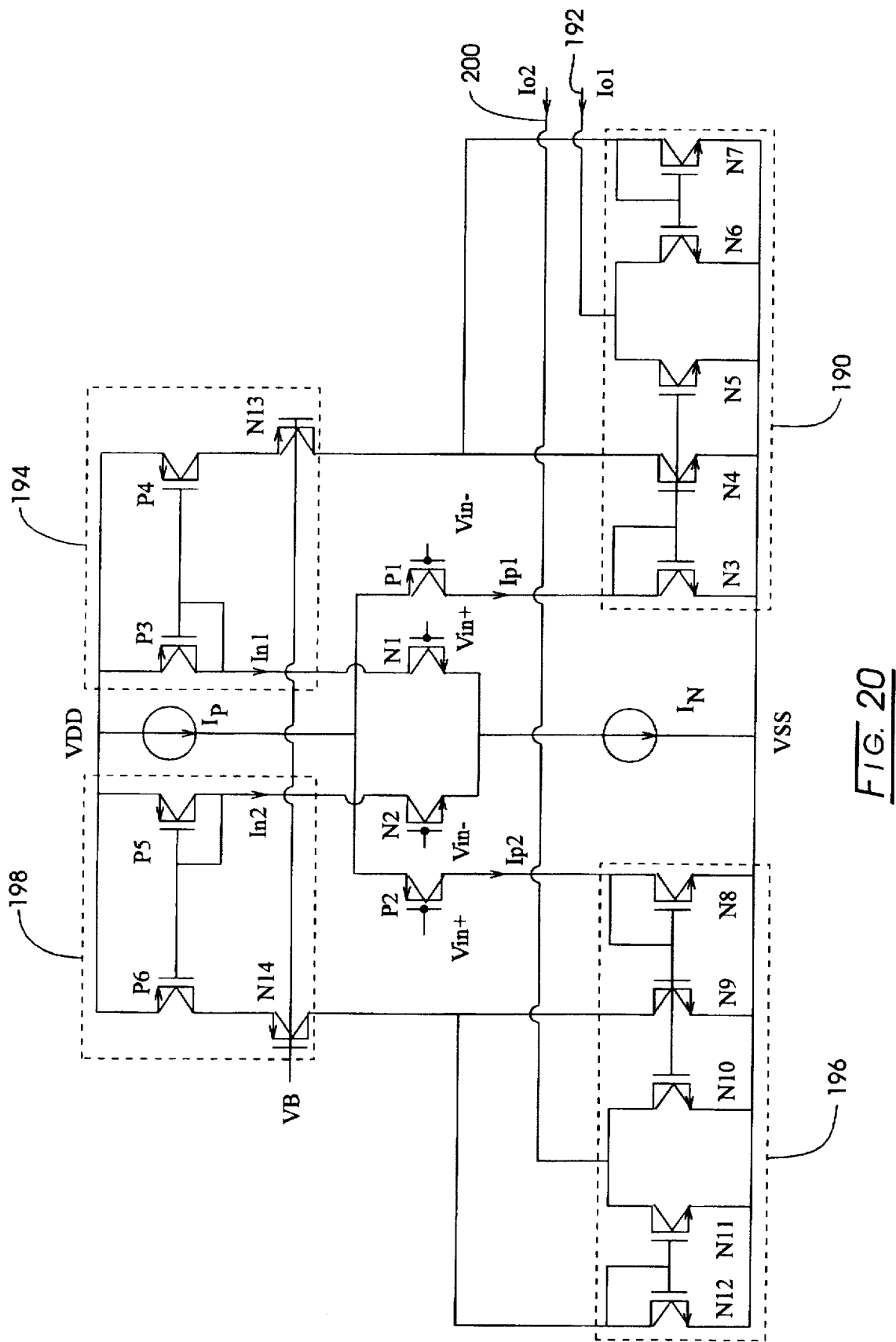
FIG. 20 is a schematic electrical diagram of an input stage according to an embodiment of the invention utilizing Total Instantaneous Current (TIC)
Figure 22:
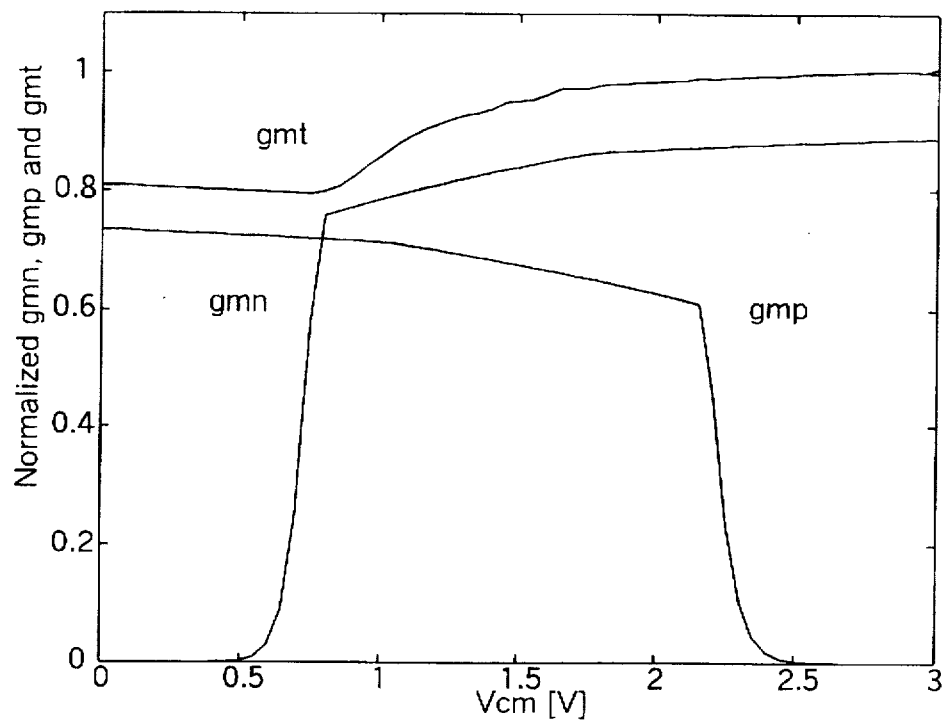
FIG. 22 is a graph showing the result of the normalized transconductance of the input stage of FIG. 20 implemented with MOS transistors operating in weak inversion.
Figure 23:
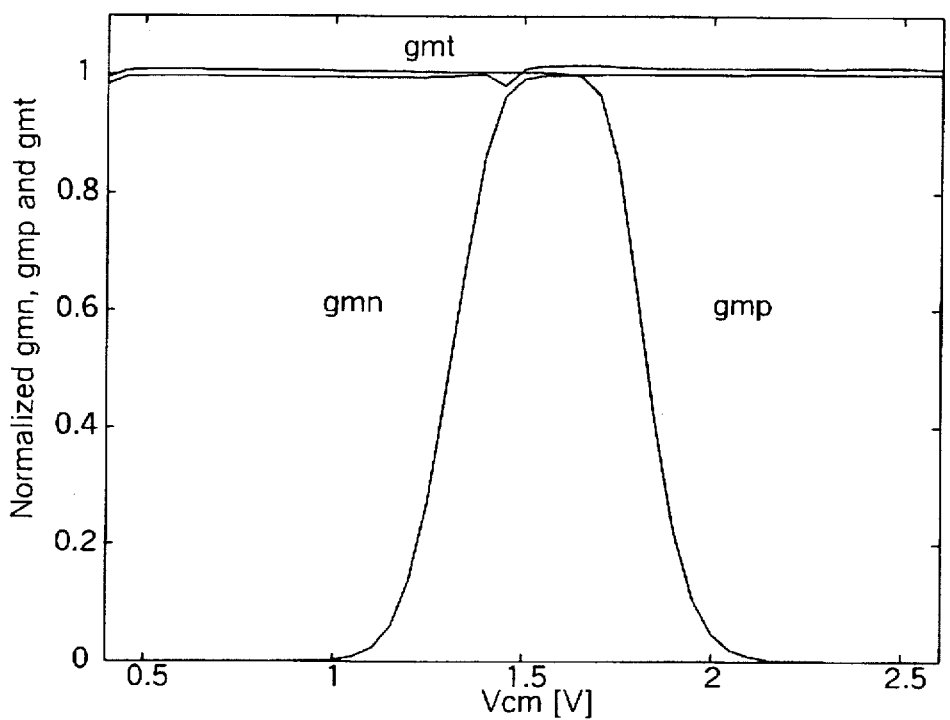
FIG. 23 is a graph showing a simulation result of the normalized transconductance of the input stage of FIG. 20 implemented with Bipolar transistors.

Returning to method 1 under Case B wherein it is recognized that as the amplitude of the information current signal increases, the DC value or term with which it is associated also increases by virtue of the activity of the common mode voltage. FIG. 20 implements this approach through the utilization of two Max-circuits in combination with two current mirror stages. One of these Max-circuits as shown in FIG. 20 within dashed boundary 190 is seen to incorporate transistors N3–N7 which produce an output Io1 in consequence of the monitoring of the outputs of the Ip1 current from stage or transistor P1 and a reversed directional value for the current variable In1. In this regard, the current at transistor N1, i.e. In1 is reversed at a current mirror formed of transistors P3 and P4 and shown within dashed boundary 194. Accordingly, the output Io1 corresponds to MAX[In1,Ip1]. The second Max-circuit is seen to be composed of transistors N8–N12 as are seen enclosed by dashed boundary 196. Max-circuit 196 monitors the current variable Ip2 from transistor P2 and a reversed version of current variable In2 from transistor N2 as developed from a mirror circuit formed of transistors P5 and P6 shown incorporated within dashed boundary 198. It may be noted that two common gate or common base transistors as at N13 and N14 are interposed in conjunction with respective mirror branches P4 and P6. Max-circuit 196 provides an output at line 200 identified as Io2 corresponding to MAX[In2,Ip2]. These two currents at lines 192 and 200 have the same form as equations (19) and (20) and the total transconductance gmt (which is equal to gm,max) is obtained. Furthermore, the bias currents can be cancelled out. FIGS. 21–23 show the simulation results of the normalized transconductance. These results are obtained by implementing the circuit shown in FIG. 20 using MOS transistors operating in strong inversion region (bias current $I_B$ is 18 μA), weak inversion ($I_B$ of 25 nA) and Bipolar transistors ($I_B$ of 20 μA), respectively. The gmt variation or error is 3% in FIGS. 21 and 23 and 20% in FIG. 22.

For the case of Bipolar implementation of FIG. 20, the input transistors N1, N2, P1 and P2 are replaced with Bipolar devices and emitter resistors are inserted at the source of n-type input pair (N1 and N2) as shown in FIG. 15. Also, an additional transistor is added in each current mirror for better accuracy of current matching as discussed in conjunction with transistor Q6 in connection with FIGS. 7C and 7D. The main advantages of this method 1 of the second approach or Case B are its simple circuit realization and low static power consumption, although the common mode input voltage could not be from rail-to-rail as discussed above under the sub-heading "Circuit Implementation".

Figure 24:
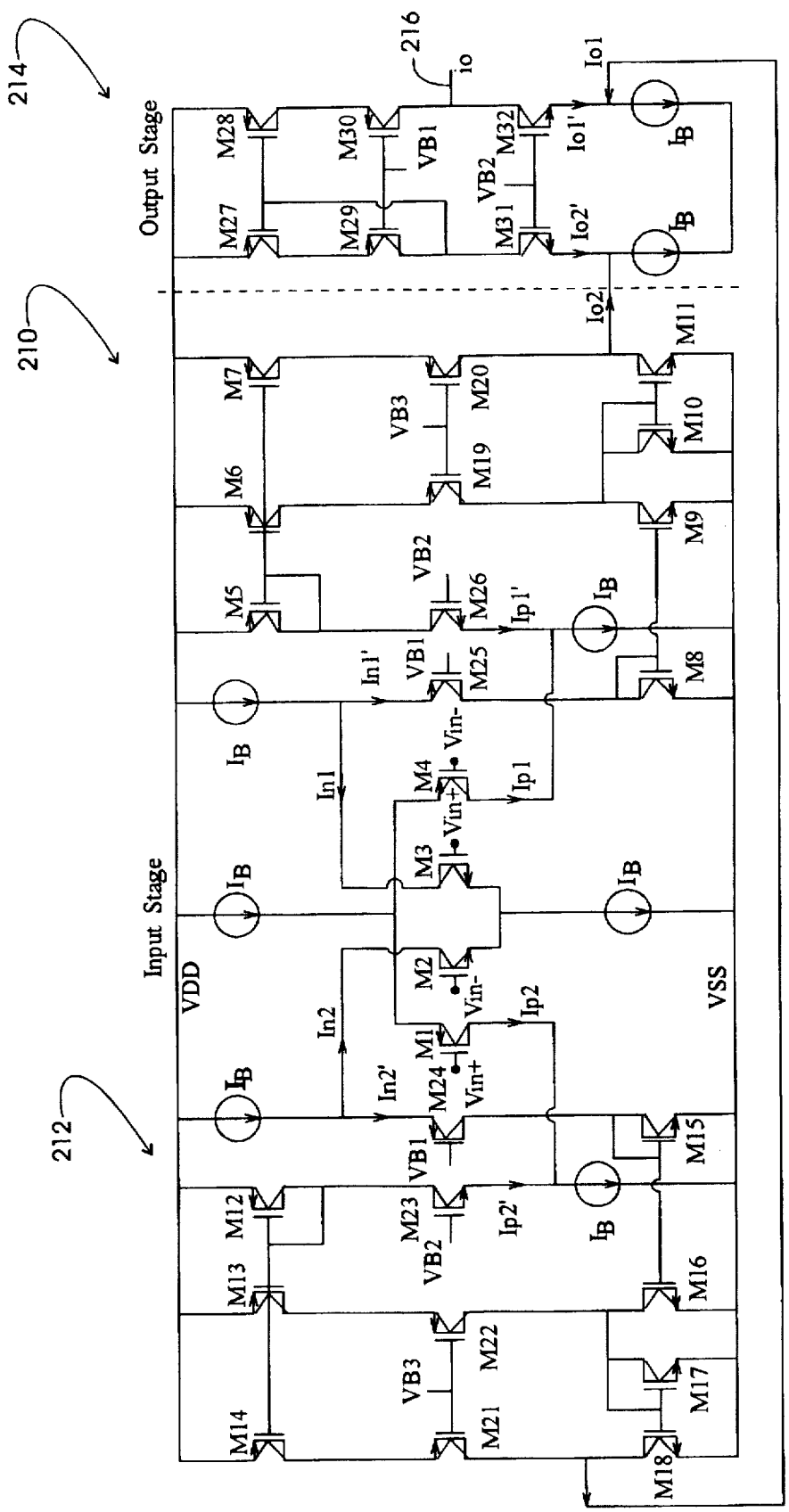
FIG. 24 is an electronic schematic diagram of a CMOS complementary input stage using TIC consisting of a complementary input stage, two Min-circuits, bias transistors, and an output stage.

A realization of method 2 for the technique of processing AC signal currents superimposed on DC tail currents is represented in FIG. 24. Utilizing universal symbolism as discussed above, the circuit of FIG. 24 comprises a complementary input stage including a p-stage M1, M4 and an inwardly disposed n-stage comprised of transistors M2 and M3. The stage subtractive features wherein transistor outputs are subtracted from bias current, $I_B$, are as described in connection with FIG. 4 above. In this regard, the In1', In2', Ip1' and Ip2' subtracted results or subtracted currents are labeled on the figure. Two Min-circuits, M5–M11 and M12–M18 are provided with the differential pair stage as are respectively identified in general at 210 and 212. To improve the performance of the Min-circuits, common gate transistors are incorporated with the circuits 210 and 212 as are represented at M19–M26. Min-circuits 210 and 212 will be recognized as essentially those Min-circuits described in connection with FIG. 8C above. Subtractive signals or variables In1' and Ip1' are directed to the Min-circuit 210, while the corresponding subtractive signals or variables In2' and Ip2' are directed to Min-circuit 212. The output of circuit 212 is represented as Io1 and is directed to an output stage represented generally at 214. Correspondingly, the output of Min-circuit 210 is identified as Io2 and is directed to that same output stage 214 as labeled.

In general, after the input voltages, vin+ and vin−, are converted to currents, the four resultant currents In1', In2', Ip1', and Ip2', respectively, are obtained by subtracting In1, In2, Ip1 and Ip2 from the bias current $I_B$. After a Min-circuit evaluation of each current pair In1', Ip1', In2', Ip2', the noted output currents Io1, Io2 are generated in the form of expressions (19) and (20) above at any common mode input voltage. The gm,max information included in Io1 and Io2 can be obtained at the output stage whose output current at line 216 may be expressed as:

$$io = Io1' - Io2' = (I_B - Io1) - (I_B - Io2) = Io2 - Io1 \quad (25)$$

It may be noted that output stage 214 is formed of a two-branch current mirror circuit including P-type transistors M27 and M28. That circuit is buttressed with common gate transistors M29–M32.

Using expressions (19) and (20), expression (25), yields the following expression:

$$io = gm,max \, v_{id} \quad (26)$$

Expression (26) guarantees that the gm is constant. To show that the proposed input stage is rail-to-rail, the minimum and maximum input common voltages should be found. The most fascile approach to obtaining Vcm,max and Vcm,min is to consider the maximum gate voltage of M2 (or M3) and a minimum gate voltage of M1 (or M4), respectively. Using Kirchhoff's Voltage Law (KVL) and ignoring body effect, the following expressions obtain:

$$\begin{aligned} Vcm,min &= V_{gs,M1} + V_{sd,M1} + V_{ds,sat,n} + VSS \quad (27) \\ &= V_{gs,M1} + V_{sg,M1} - |V_{Tp}| + V_{ds,sat,n} + VSS \\ &= V_{ds,sat,n} - |V_{Tp}| + VSS \\ Vcm,max &= VDD - V_{sd,sat,p} - V_{sat,M2} - V_{sg,M2} \quad (28) \\ &= VDD - V_{sd,sat,p} - V_{gs,M2} + V_{Tn} - V_{sg,M2} \\ &= VDD - V_{sd,sat,p} + V_{Tn} \end{aligned}$$

where $V_{ds,sat,n}$ and $V_{sd,sat,p}$ are the minimum drain-source saturation voltages of NMOS and PMOS current sources, respectively.

As a consequence, the common mode input voltage can even extend above the positive rail by $(V_{Tn} - V_{sd,sat,p})$ and below the negative rail by $(-|V_{Tp}| + V_{ds,sat,n})$ with a constant gin. Output stage 214 simply subtractively combines the inputs Io1 and Io2 to remove the DC term from those two signals and, in effect, carry out an amplification of the resultant AC component of the signal.

Figure 25:
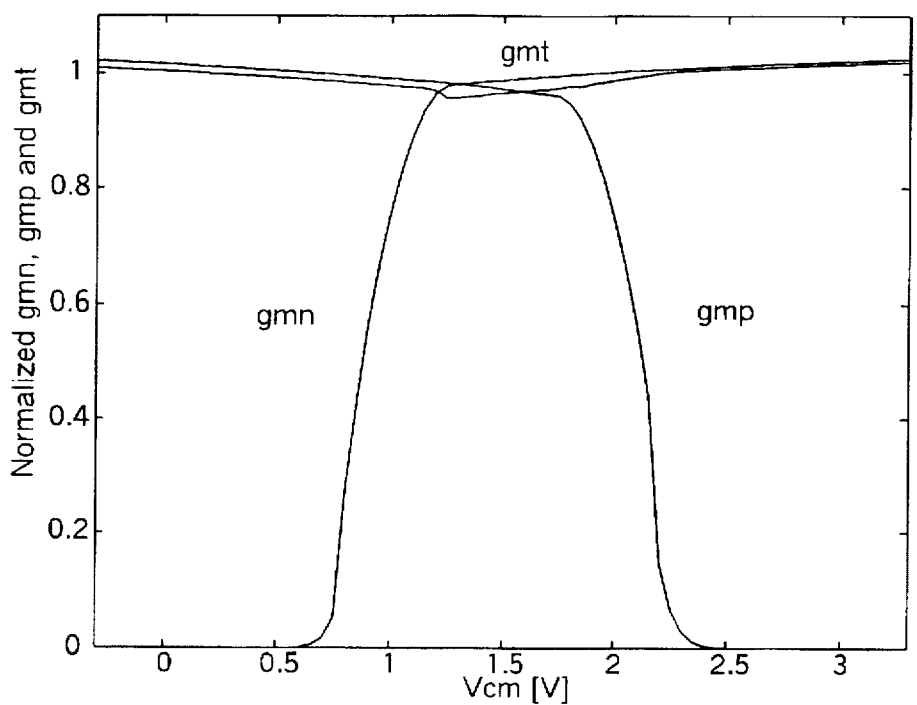
FIG. 25 is a graph showing a simulation result of the normalized transconductance of the input stage of FIG. 24 implemented with MOS transistors operating in strong inversion.
Figure 26:
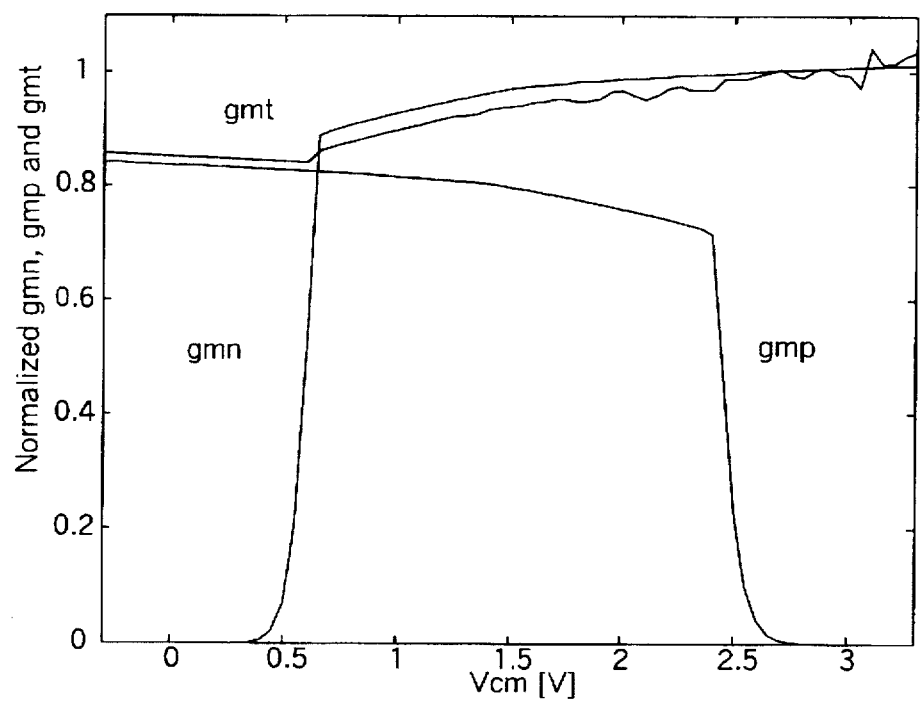
FIG. 26 is a graph showing a simulation result of the normalized transconductance of the input stage of FIG. 24 implemented with MOS transistors operating in weak inversion.
Figure 27:
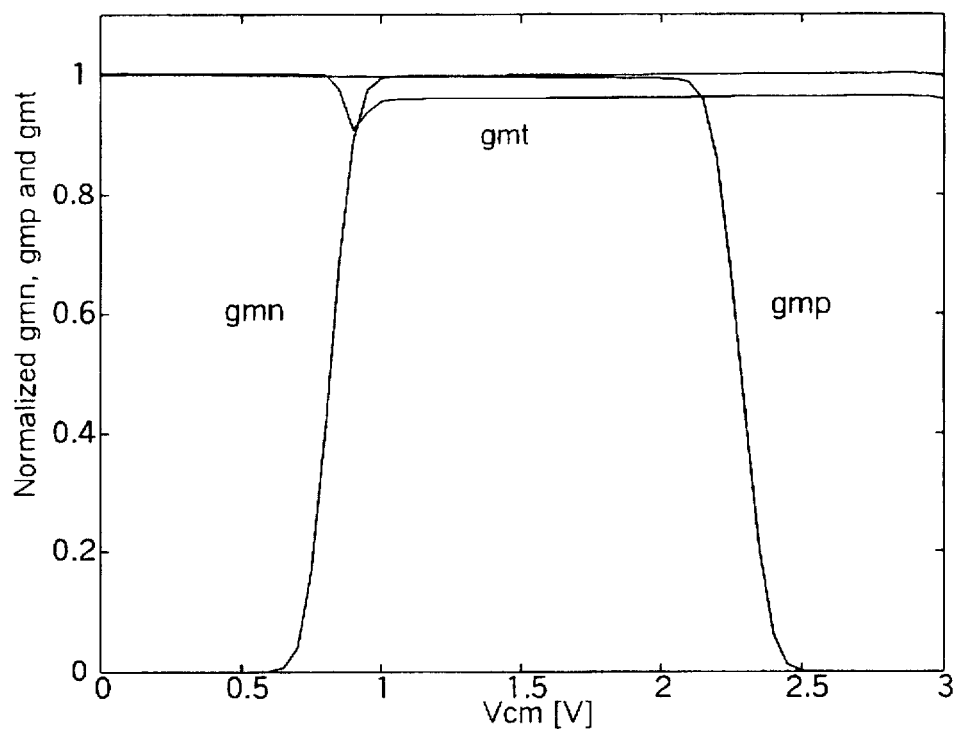
FIG. 27 is a graph showing a simulation result of the normalized transconductance of the input stage of FIG. 24 implemented with Bipolar transistors.

FIGS. 25, 26, and 27 show the simulation results of normalized transconductance when the circuit of FIG. 24 is implemented with MOS transistors operating, respectively, in strong inversion region (bias current $I_B$ is 18 µA), weak inversion ($I_B$ of 25 nA), and with Bipolar transistors ($I_B$ of 20 µA). Note that the common mode input voltage exceeds both rails by at least 300 mV in FIGS. 25 and 26. The variation of gmt is at most 5% in FIG. 25.

Figure 28:
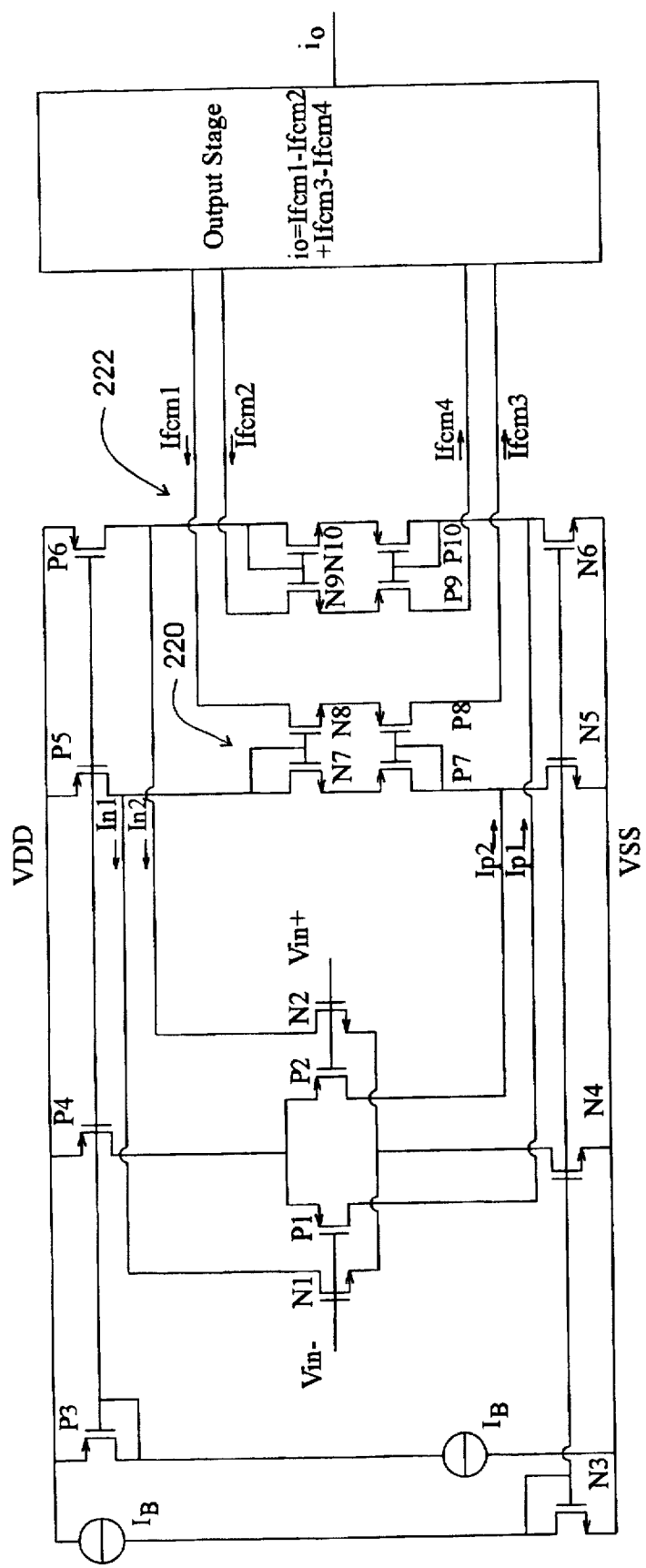
FIG. 28 is an electrical schematic diagram of a constant transconductance input stage employing floating current mirror circuits.

Another implementation of the input stage of the invention based on processing the total current, i.e. DC current plus the AC signal, is represented in FIG. 28. In the figure, the complementary differential input stages are shown to include transistor pairs N1, N2, and P1, P2. Transistors N3–N6 comprise a current mirror which functions as a current source and, similarly, transistors P3–P6 carry out the same function. Two floating current mirrors are represented in general at 220 and 222 formed, respectively, of transistor branches N7, N8 and P7, P8, and N9, N10, and P9, P10. The currents In1, In2, Ip1, Ip2 are equal to:

$$In1 = \frac{I_N}{2} - gmn \frac{v_{id}}{2} \quad (29)$$

$$In2 = \frac{I_N}{2} + gmn \frac{v_{id}}{2} \quad (30)$$

$$Ip1 = \frac{I_P}{2} + gmp \frac{v_{id}}{2} \quad (31)$$

$$Ip1 = \frac{I_P}{2} - gmp \frac{v_{id}}{2} \quad (32)$$

where $I_N/2$ and $I_P/2$ are the DC currents through the n-channel transistors of the n-input stage and p-channel transistors of the p-input differential pair, respectively. These currents are dependent on the input common mode voltage. In the above expressions (29)–(32), gmn and gmp denote the transconductance of n-channel and p-channel transistors, respectively. The current through the floating current mirror 220 is equal to:

$$Ifcm1 = Ifcm3 = MIN\,(I_B - In1, I_B - Ip2) \quad (33)$$

$$Ifcm2 = Ifcm4 = MIN\,(I_B - In2, I_B - Ip1) \quad (34)$$

The above equations can be rewritten as $$Ifcm1 = Ifcm3 = I_B - MAX(In1, Ip2) \quad (35)$$

$$Ifcm2 = Ifcm4 = I_B - MAX(In2, Ip1) \quad (36)$$

substituting expressions (29) through (32) in expressions (35) and (36) gives $$Ifcm1 = Ifcm3 = I_B - MAX\left(\frac{I_N}{2} - gmn \frac{v_{id}}{2}, \frac{I_P}{2} - gmp \frac{v_{id}}{2}\right) \quad (37)$$

$$Ifcm2 = Ifcm4 = I_B - MAX\left(\frac{I_N}{2} + gmn \frac{v_{id}}{2}, \frac{I_P}{2} + gmp \frac{v_{id}}{2}\right) \quad (38)$$

The output current io is equal to:

$$io = Ifcm1 - Ifcm2 + Ifcm3 - Ifcm4 \quad (39)$$

Expression 39 shows that an improved amplification of the AC component of the signal is achieved while the DC term has been eliminated as a consequence of the subtracting of the current mirror signals and the AC signal is amplified by a factor of 2.

As proven hereinabove, the output current can be written as:

$$i_o = 2MAX(g_{mn}, g_{mp})v_{id} \quad (40)$$

Figure 29:
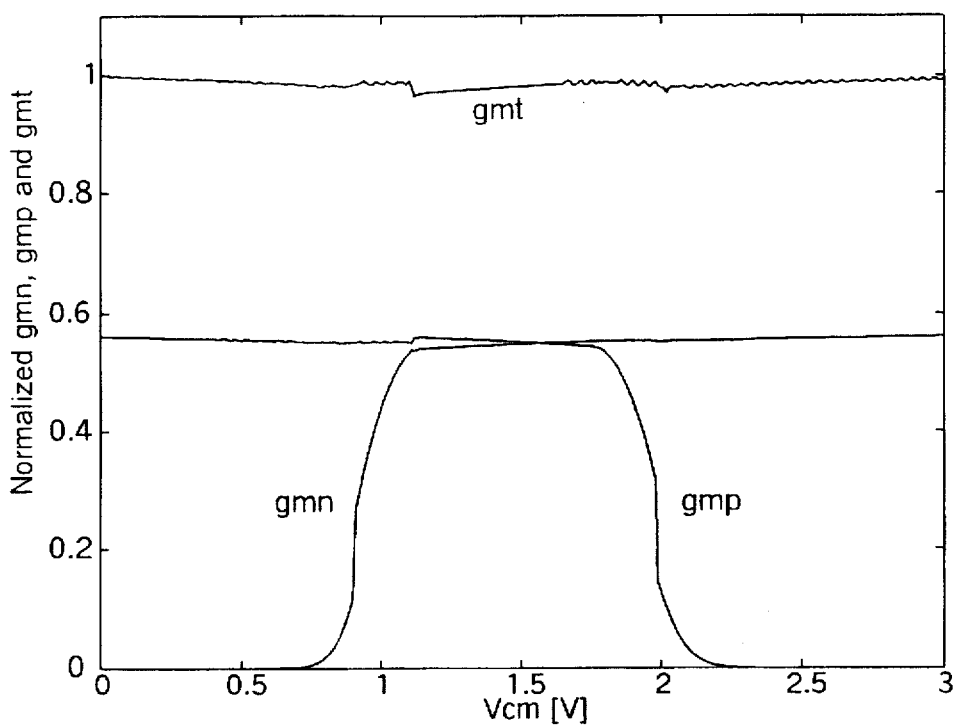
FIG. 29 is a graph showing a simulation result of the normalized transconductance of the input stage of FIG. 28 implemented with MOS transistors operating in strong inversion.

Therefore, this scheme can achieve constant transconductance independent of common mode voltage. FIGS. 29 and 30 show the transconductance of this input stage in strong and weak inversion, respectively.

In the discourse above, MAX(gmn,gmp) performance has been associated with an aligning of the transconductance levels or curves. The transconductance parameter in general is proportional to W or the width of a transistor and is inversely proportional to the length. It is also proportional to certain other process dependent parameters. A factor which enters into the development of the transistors used with the circuit is concerned with the relative mobility of electrons as compared with holes. The former show a higher mobility. Thus, it is necessary to offset the lower mobility of hole-based or p-type devices with larger size. This permits a matching of the transconductance of the p-type devices with that of the n-type devices. In this regard, the transconductance parameter kn is set equal to kp by a proper sizing of the respective NMOS and PMOS transistors. A device independent input stage can be developed through the utilization of a composite transistor. The composite transistor has the equivalent process parameter of:

$$\frac{1}{\sqrt{k_{eq}}} = \frac{1}{\sqrt{k_n}} + \frac{1}{\sqrt{k_p}} \quad (41)$$

and the equivalent threshold voltage of:

$$V_{Teq} = V_{Tn} + |V_{Tp}| \quad (42)$$

FIG. 31A shows a composite NMOS transistor which is formed of an n-type transistor exhibiting a transconductance parameter, kn, and a p-type transistor exhibiting a transconductance parameter, kp. By utilizing the gate of the n-type transistor as the gate of the composite transistor and utilizing the gate of the p-type transistor as a source terminal, a composite transistor with a transconductance parameter keq is achieved as represented symbolically at 230. Similarly, as shown at FIG. 31B, by assigning the gate of the NMOS transistor as the source of the composite transistor and the gate of the PMOS transistor as the gate of the composite transistor, then a PMOS equivalent composite transistor is achieved as represented in general by the symbol at 232.

Figure 32:
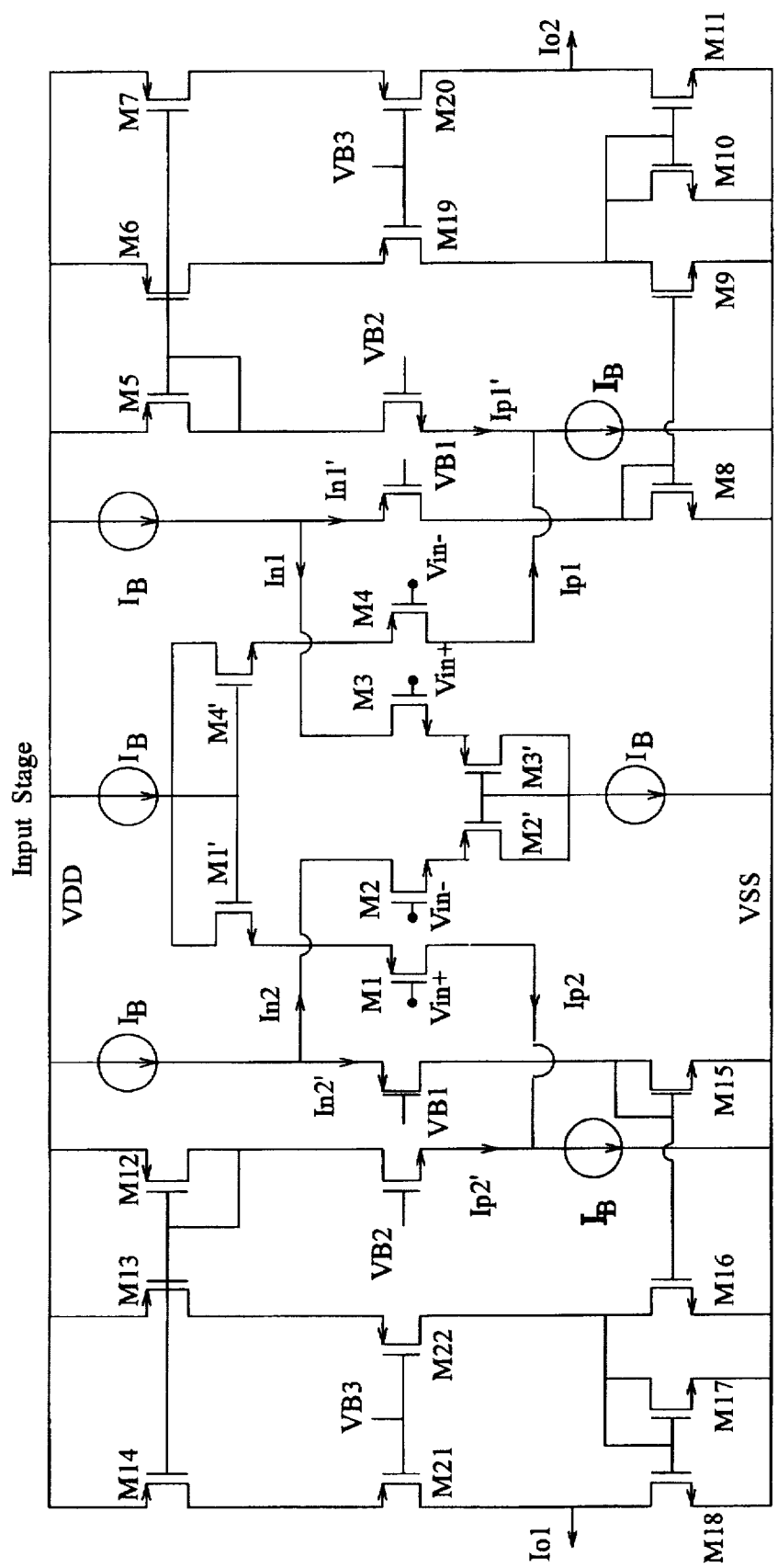
FIG. 32 is an electrical schematic diagram showing input stage according to the invention achieving rail-to-rail constant transconductance using composite transistors for input pairs.
Figure 33:
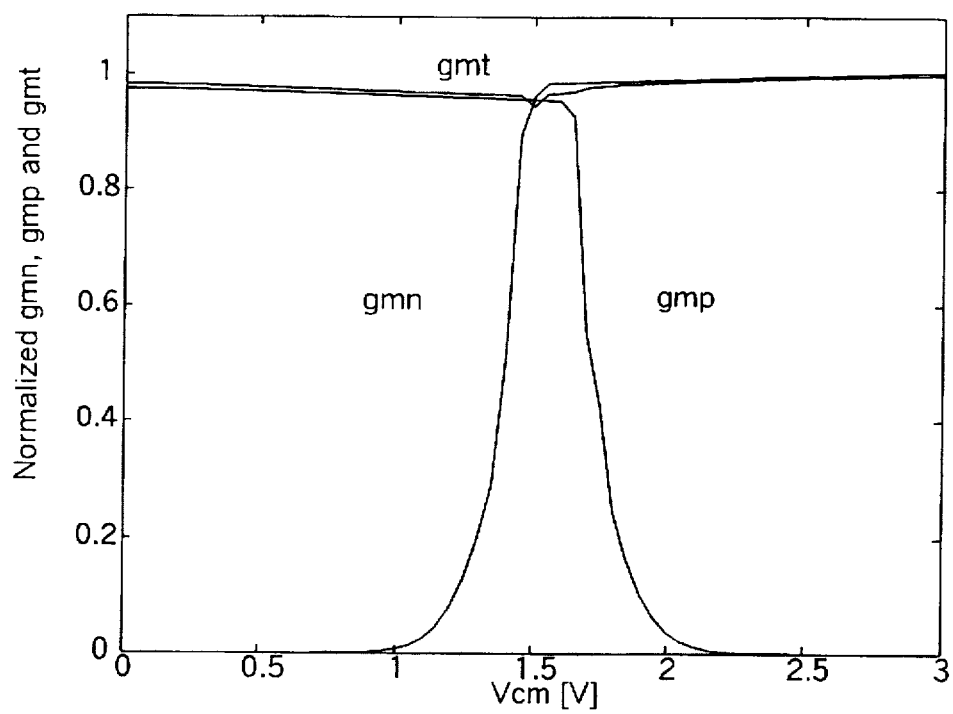
FIG. 33 is a graph showing a simulation result of the normalized transconductance of the input stage of FIG. 32.

Referring to FIG. 32, the input stage earlier described in connection with FIG. 24 above is seen to be implemented with composite transistors. Thus, the p-stage pair earlier described at M1, M4 in FIG. 24 is present as composite transistors M1, M1' and M4, M4'. In similar fashion, the n-stage pair described in FIG. 24 at M2, M3 is now present as the composite transistor arrangement M2, M2' and M3, M3'. This approach becomes useful when $V_{Tn}$ and $V_{Tp}$ are small because the minimum operating voltage is equal to $2V_{Tn} + 2V_{Tp} + 2V_{ds,sat}$. For typical utilizations of the approach, larger voltages will be called for. The simulated transconductance of the composite input stage of FIG. 32 is shown in FIG. 33, when $I_B = 4$ µA.

Figure 34:
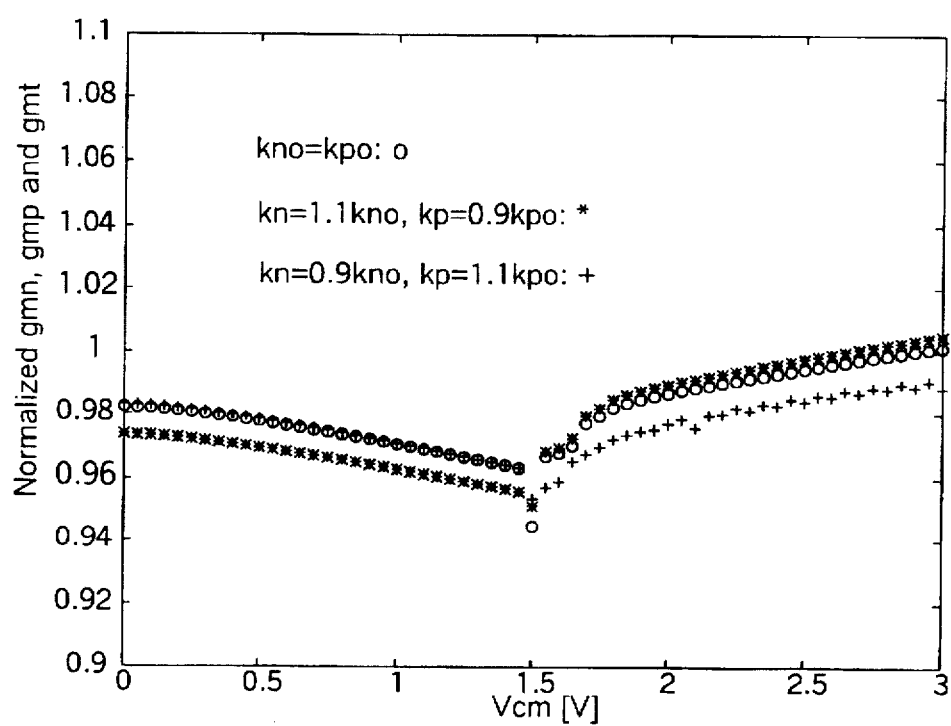
FIG. 34 is a graph showing a simulation result of the normalized transconductance of the input stage of FIG. 32 with different values of kn and kp.

Referring to FIG. 34, three curves are illustrated, represented by o's, stars, and crosses, which serve to show by simulation that the design represented by the composite transistor-based stage shown at FIG. 32 is insensitive to variations of transconductance parameters kn and kp. The curve represented by a sequence of o's shows the situation where kn is equal to kp. Correspondingly, the curve represented by stars represents an increase of kn by 10% and a decrease of kp by 10%. Finally, the curve represented by crosses shows a decrease of kn by 10% and an increase of kp by 10%. The curves demonstrate the insensitivity of the approach to transconductance parameter alteration.

Since certain changes may be made in the above-described apparatus and method without departing from the scope of the invention herein, it is intended that all matter contained in the description thereof or shown in the accompanying drawings shall be interpreted as illustrative and not in a limiting sense.

We claim:

1. A method for operating an integrated circuit to enhance the consistency of transconductance exhibited by it, said circuit comprising a differential input stage having at least a first transistor pair of a first conductivity type providing a first output in response to an applied input signal and having at least a second transistor pair of a second conductivity type electrically coupled in parallel with said first transistor pair and responsive to said applied input to provide a second output, said method comprising the steps of:

simultaneously processing said first and second outputs with respect to the amplitudes exhibited thereby;

selecting that instantaneously occurring one of said first output or said second output exhibiting the highest amplitude to provide a selected output; and applying said selected output corresponding with said highest amplitude, to a next stage of said integrated circuit.

2. The method of claim 1 in which:

said processing step monitors said first and second outputs with respect to their instantaneous current values; and said selecting step is carried out continuously to provide said selected output as a current, exhibiting said highest amplitude.

3. The method of claim 1 in which said applying step inputs said applied output to a stage of an operational amplifier as said next stage.

4. The method of claim 2 in which:

said processing step carries out a D.C. term removal by subtraction of a first current component of said first output from a second current component of said first output which is opposite in phase from said first current component to derive a difference current, $i_{dif1}$, and carries out said D.C. term removal by subtraction of a third current component of said second output from a fourth component of said second output which is opposite in phase from said third current component to derive a difference current, $i_{dif2}$; and said applying step provides said selected output, io as MAX ($i_{dif1}$, $i_{dif2}$).

5. The method of claim 1 in which:

said first transistor pair is of an n-conductivity type wherein said first output includes currents In1, In2, each having a D.C. term and a superimposed A.C. signal;

said second transistor pair is of a p-conductivity type wherein said second output includes currents, Ip1, Ip2 each having said D.C. term of the first transistor pair or another D.C term other than said first transistor pair D.C. term;

said differential input stage having a bias current, $I_B$ applied thereto; and said selecting step finds two currents, Io1 and Io2 which correspond respectively to MAX (In1, Ip1) and MAX (In2, Ip2), each exhibiting said A.C. signal combined with a max one of said D.C. terms.

6. The method of claim 5 wherein said selecting step includes the step of subtractively combining said currents Io1 and Io2 to remove said D.C. terms and providing said combined currents as said selected output.

7. The method of claim 1 in which:
said first transistor pair is of an n-conductivity type wherein said first output includes currents In1, In2, each having a D.C. term and a superimposed A.C. signal;
said second transistor pair is of a p-conductivity type wherein said second output includes currents Ip1, Ip2 each having said D.C. term of the first transistor pair or another D.C. term other than said first transistor pair D.C. term;
said differential input stage having a bias current, $I_B$ applied thereto; and
said processing step initially carries out a subtraction of each said current, In1, In2, Ip1, Ip2 from said bias current, $I_B$ to derive respective currents, In1', In2', Ip1', Ip2', then first and second output currents Io1, Io2, respectively, are determined as the minimums MIN (In1', Ip1'), MIN(In2', Ip2').

8. The method of claim 7 wherein said selecting step includes the step of subtractively combining said first and second output currents Io1 and Io2 to remove said D.C. terms and providing said combined currents as said selected output.

9. An integrated circuit, comprising:
a differential stage having at least an n-type transistor pair and at least a p-type transistor pair, said n-type and p-type transistor pairs being electrically coupled in parallel and responsive to an applied input to respectively provide corresponding first and second current outputs which are common mode voltage dependent; and
a selection circuit responsive to said current outputs and providing a selected current output corresponding with the first and second current output which exhibits a maximum current amplitude and maximum stage transconductance as an input to a next stage of said integrated circuit.

10. The integrated circuit of claim 9 in which said n-type and p-type transistor pairs are formed of composite transistors.

11. The integrated circuit of claim 9 in which:
said n-type transistor pair provides said first current output as two output currents In1 and In2 corresponding with said applied input and combined with a DC term;
said p-type transistor pair provides said second current output as two output currents Ip1 and Ip2 corresponding with said applied input combined with said or another DC term;
including a subtraction circuit responsive to derive difference currents $I_{diff1}$ and $I_{diff2}$ respectively as the subtractive combination of Ip1 with In2 and Ip1 with Ip2 exhibiting no DC term; and
said selection circuit provides said selected current output as that said difference current exhibiting maximum absolute amplitude.

12. The integrated circuit of claim 9 in which:
said differential stage comprises first and second n-type transistor pairs and third and fourth p-type transistor pairs, said n-type and p-type transistor pairs being electrically coupled in parallel and responsive to said applied input to provide said first current output as two current outputs, one from each of said first and second n-type transistor pairs and said second current output as two current outputs, one from each of said third and fourth p-type transistor pairs;
including a first subtraction circuit coupled to subtractively combine said two current outputs of said first n-type transistor pair to provide a difference current, $i_{n1}$;
including a second subtraction circuit coupled to subtractively combine said two current outputs of said second n-type transistor pair to provide a difference current, $i_{n2}$;
including a third subtraction circuit coupled to subtractively combine said two current outputs of said third p-type transistor pair to provide a difference current, $i_{p1}$;
including a fourth subtraction circuit coupled to subtractively combine said two current outputs of said fourth p-type transistor pair to provide a difference current, $i_{p2}$;
said selection circuit comprises:
a first Max-circuit responsive to said difference current $i_{n1}$ and to said difference current, $i_{p1}$ to select that difference current exhibiting maximum amplitude and having a max-output, $i_{o1}$ of given phase corresponding therewith;
a second Max-circuit responsive to said difference current, $i_{n2}$ and to said difference current, $i_{p2}$ to select that difference current exhibiting maximum amplitude and having a max-output, $i_{o2}$ corresponding therewith displaced in phase 180° from said given phase, and
an output stage responsive to said max-output, $i_{o1}$ and said max-output, $i_{o2}$, to subtractively combine them to provide said selected current output.

13. The integrated circuit of claim 12 in which each said first and second subtraction circuits comprises:
a two, branch p-type current mirror circuit having an intermediate output of given current direction; and
an auxiliary, two branch p-type branch current mirror circuit responsive to said intermediate output to provide said respective difference current.

14. The integrated circuit of claim 12 in which each said third and fourth subtraction circuits comprise a two branch n-type current mirror circuit.

15. The integrated circuit of claim 12 in which each said first and second Max-circuit comprises:
a first, three branch n-type, current mirror circuit, two branches of which are each responsive to a discrete one of said respective difference currents and one branch provides said max-output; and
a second, two branch n-type, current mirror circuit, one branch of which is coupled with that said first current mirror branch which provides said max-output and the other branch of which is coupled with one said first current mirror circuit branch which is responsive to a discrete one of said respective difference currents.

16. The integrated circuit of claim 9 in which:
said n-type transistor pair provides said first current output as two output currents In1 and In2 corresponding with said applied input and combined with a bias current derived DC term;
said p-type transistor pair provides said second current output as two output cents Ip1 and Ip2 corresponding with said applied input and combined with said or another bias current derived DC term;

said selection circuit comprises:

a first Max-circuit responsive to said output currents In1 and Ip1 of common phase relationship to select that output current exhibiting maximum amplitude and having a max-output, Io1 of given phase, a second Max-circuit responsive to said output currents In2 and Ip2 of common phase relationship to select that output current exhibiting maximum amplitude and having a max-output, Io2 of phase opposite said given phase; and an output stage responsive to said max-output Io1, and said max-output Io2, to subtractively combine them to remove said DC terms and derive said selected current output.

17. The integrated circuit of claim 16 in which said first Max-circuit includes:

a first current reversing circuit responsive to said output current In1 for deriving reversed In1 current;

a first, three branch n-type, current mirror circuit having a first branch responsive to said reversed In1 current, a second branch responsive to said output current Ip1 and a third branch deriving said max-output, Io1;

a second two branch n-type, current mirror circuit having a first branch coupled with said first current mirror circuit first branch and having a second branch coupled with said first current mirror circuit third branch.

18. The integrated circuit of claim 17 in which said second Max-circuit includes:

a second current reversing circuit responsive to said output current, In2 for deriving a reversed In2 current;

a third, three branch n-type, current minor circuit having a first branch responsive to said reversed In2 current, a second branch responsive to said output current, Ip2, and a third branch providing said max-output Io2 and a fourth, two branch n-type current mirror circuit having a first branch coupled with said third current mirror circuit first branch and having a second branch coupled with said third current mirror circuit third branch.

19. The integrated circuit of claim 9 in which:

said differential stage n-type transistor pair provides said first current output as In1 and In2;

said p-type transistor pair provides said second current output as Ip1 and Ip2 and each said transistor pair having a bias current $I_B$ applied thereto;

said selection circuit comprises:

a fast floating current mirror having two n-type branches and two p-type branches and responsive to said current outputs In2 and Ip1 to derive mirror outputs Ifcm2 and Ifcm4;

a second floating current minor having two n-type branches and two p-type branches and responsive to said current outputs In1 and Ip2 to derive mirror outputs Ifcm1 and Ifcm3, wherein:

Ifcm1=Ifcm3=$I_B$−MAX(In1,Ip2) and

Ifcm2=Ifcm4=$I_B$−MAX(In2,Ip1) and an output circuit responsive to said mirror outputs to provide said selected output in correspondence with the expression io=Ifcm1−Ifcm2+Ifcm3−Ifcm4.

20. An integrated circuit, comprising:

a differential stage having an n-type transistor pair and a p-type transistor pair, said n-type and p-type transistor pairs having a bias current, $I_B$, applied thereto and being electrically coupled in parallel and responsive to an applied input to provide respective current outputs In1, In2, and Ip1, Ip2 corresponding with said applied input and combined with a DC term;

a processing circuit for subtracting said current outputs In1, In2, Ip1 and Ip2 from said bias current, $I_B$ to provide respective subtracted currents In1', In2', Ip1' and Ip2' each exhibiting said or another DC term;

a first selector circuit responsive to said subtracted currents In1' and Ip1' for providing an initial output Io2 corresponding with a minimum amplitude of simultaneously occurring said subtracted currents In1' and Ip1'; and a second selector circuit responsive to said subtracted currents In2' and Ip2' for providing an initial output Io1 corresponding with a minimum amplitude of simultaneously occurring said subtracted currents In2' and Ip2'.

21. The integrated circuit of claim 20 further comprising an output circuit responsive to subtractively combine said initial outputs Io1 and Io2 to provide a selected output, io exhibiting no DC term.

22. The integrated circuit of claim 20 in which said n-type and p-type transistor pairs are present as composite transistor pairs.

23. The integrated circuit of claim 20 in which:

said selector circuit comprises a current mode minimum amplitude selecting circuit including a first, three-branch p-type current mirror circuit having a first branch responsive to said subtracted current Ip1', a second branch, and a third branch in electrical connection with said initial output Io2, a second n-type two-branch current mirror circuit having a first branch responsive to said subtracted current In1' and a second branch coupled with said first current mirror circuit second branch, and a third n-type two-branch current mirror circuit having a first branch coupled with said second of said first and second current mirror circuits,and having a second branch coupled with said first current mirror third branch.

24. The integrated circuit of claim 21 in which said output circuit comprises a p-type two-branch current mirror circuit having a first branch coupled to said initial output Io1 and said bias current $I_B$ and a second branch coupled with said initial output Io2 and said bias current $I_B$ and deriving said selected output.

* * * * *